(12) United States Patent
Schaumont et al.

(10) Patent No.: US 6,233,540 B1
(45) Date of Patent: May 15, 2001

(54) DESIGN ENVIRONMENT AND A METHOD FOR GENERATING AN IMPLEMENTABLE DESCRIPTION OF A DIGITAL SYSTEM

(75) Inventors: Patrick Schaumont, Wijgmaal; Serge Vernalde, Heverlee; Johan Cockx, Pellenberg, all of (BE)

(73) Assignee: Interuniversitair Micro-Elektronica Centrum, Leuven (BE)

( * ) Notice: Subject to any disclaimer, the term of this patent is extended or adjusted under 35 U.S.C. 154(b) by 0 days.

(21) Appl. No.: 09/041,985

(22) Filed: Mar. 13, 1998

Related U.S. Application Data

(60) Provisional application No. 60/039,078, filed on Mar. 14, 1997, provisional application No. 60/039,079, filed on Mar. 14, 1997, and provisional application No. 60/041,121, filed on Mar. 20, 1997.

(51) Int. Cl.[7] .................................................. G06F 17/50
(52) U.S. Cl. .................................................. 703/14; 703/15
(58) Field of Search .................... 395/500.34, 500.35, 395/500.36, 500.19, 500.41; 703/14–16; 716/4, 5, 6; 707/103; 345/964

(56) References Cited

U.S. PATENT DOCUMENTS

| 5,493,508 |   | 2/1996 | Dangelo et al. ................. 364/489 |
| 5,544,067 | * | 8/1996 | Rostoker et al. ............ 395/500.35 |
| 5,623,418 | * | 4/1997 | Rosotker et al. ............ 395/500.02 |
| 5,726,902 | * | 3/1998 | Mahmood et al. ........... 395/500.07 |
| 5,870,585 | * | 2/1999 | Stapleton ..................... 395/500.36 |
| 5,923,867 | * | 7/1999 | Hand ................................... 703/14 |
| 6,064,819 | * | 5/2000 | Franssen et al. ..................... 717/9 |

FOREIGN PATENT DOCUMENTS

| 0 445 942 A2 | 2/1991 | (EP) ............... G06F/15/60 |

OTHER PUBLICATIONS

Swamy, Sowmitri, et al.; OO–VHDL. Object–oriented extensions to VHDL; *Computer*, vol. 28 (No. 10): pp. 18–26; Oct., 1995.

Gupta, Rajesh K., et al.; Using a Programming Language for Digital System Design; *IEEE Design & Test Of Computers*; pp. 72–80; Apr.–Jun., 1997.

Schaumont, et al. "Synthesis of Multi–rate and Variable Rate Circuits for High Speed Telecommunications Applications" XP–002114732, 1997, pp. 542–546.

Verkest, et al. "CoWare—A Design Environment for Heterogeneous Hardware/Software Systems" Design Automation for Embedded Systems, XP–022114730, 1996, pp. 357–386.

Lanneer, et al. "An Object–Oriented Framework Supporting the full High–Level Synthesis Trajectory" Computer Hardware Description Languages and their Applications, XP–002114731, 1991, pp. 301–320.

Woo, et al. "Codesign from Cospecification" Computing Practices, XP–002114728, 1994, pp. 42–47.

Bill Lin, "System Design Tools for Broadband Telecom Network Applications" XP–002114729, 1996, pp. 23–26.

(List continued on next page.)

*Primary Examiner*—Kevin J. Teska
*Assistant Examiner*—Douglas W. Sergent
(74) *Attorney, Agent, or Firm*—Knobbe, Martens, Olson & Bear, LLP

(57) ABSTRACT

The present invention is a design apparatus compiled on a computer environment for generating from a behavioral description of a system comprising at least one digital system part, an implementable description for said system, said behavioral description being represented on said computer environment as a first set of objects with a first set of relations therebetween, said implementable description being represented on said computer environment as a second set of objects with a second set of relations therebetween, said first and second set of objects being part of a design environment.

27 Claims, 21 Drawing Sheets

OTHER PUBLICATIONS

Sarkar, S.; Basu, A.; Majumdar, A.K.;"Synchronization of Communicating Modules and Processes in High Level Synthesis", Proceedings of the 8th International Conference on VLSI Design, a995, pp. 87–92, Jan. 1995.*

De Micheli, G.; Ku, D.; Mailhot, F.; Truong, T.;"The Olympus Synthesis System", IEEE Design & Test of Computers, vol. 7, Issue 5, pp. 37–53, Oct. 1990.*

Lavenier, D.; McConnell, R.;"From Behavioral to RTL Models: An Approach", Proceedings of the Fifth International Workshop on Rapid System Prototyping, 1994, ppl 153–161, Jun. 1994.*

Sarkar, S.; Basu, A.; Majumdar, A.K.;"Synchronization of Comunicating Modules and Processes in High Level Synthesis", Proc. of the 8th International Conference on VLSI Design, a995, pp. 87–92, Jan. 95.*

De Micheli, G.; Ku, D.; Malihot, F.; Truong, T.;"The Olympus Synthesis System", IEEE Design & Test of Computers, vol. 7, Issue 5, pp. 37–53, Oct. 1990.*

Yang, L.; Perkowski, M.A.; Smith, D.;"Object–Oriented Design of an Expandable Hardware Description Language Analyzer for a High Level Synthesis System", Proc. Twenty–fifth Hawaii Inter. Conf. on System Sciences, 1992, vol. 2, pp, Jan. 1992.*

Lavenier, D.; McConnell, R.;"From Behavioral to RTL Models: An Approach", Proceedings of the Fifth International Workshop on Rapid System Prototyping, 1994, ppl 153–161, Jun. 1994.*

York, G.; Mueller–Thuns, R.; Patel, J.; Beatty, D.;"An Integrated Environment for HDL Verification", Proceedings of the IEEE International Verilog HDL Conference, 1995, ppl 9–18, Mar. 1995.*

Pangrle, B.M.; Pao–Po Hou; Owens, R.M., Irwin, M.J.;"An Integrated Multi–level Synthesis System", First International Workshop on Rapid System Prototyping, 1990, pp. 167–175, Jun. 1990.*

Hylander, P.; Meador, J.; "Object Oriented VLSI Design Automation for Pulse Coded Neural Networks", 1994 IEEE International Conference on Neural Networks, vol. 3, pp. 1825–1829, Jul. 1994.*

Basu, A.; Majumdar, A.K.; Sarkar, S.;"DOORS: An Object–Oriented CAD System for High Level Synthesis", IEE Proceedings—Computers and Digital Techniques, vol. 144, Issue 5, pp. 331–342, Sep. 1997.*

Burr et al., "OPERAS in a DSP CAD Environment", Proceedings of the European Design Automation Conference, Sep. 1994, pp. 130–135.*

Poechmueller et al, "A CAD Tool for Designing Large, Fault–Tolerant VLSI Arrays", Proceedings of the First Great Lakes Symposium on VLSI, 1991, pp. 132–137.*

Tanurhan et al., "An Approach for Integrated Specification and Design of Real–Time Systems", Proceedings of the EURO–VHDL'96 and European Design Automation, Sep. 1996, pp. 258–263.*

Vemuri et al., "An Integrated Multicomponent Synthesis Environment for MCMs", Computer, vol. 26, Issue 4, pp. 62–74, Apr. 1993.*

Stoel et al. "VIOOL for Hardware/Software Codesign", Proc. 1995 Inter. Symp. on Sys. Eng. of Computer Bases Systems, pp. 333–340, Mar. 1995.*

Brendenfeld et al. "Tool Integration and Construction using General Graph–based Design Representations", Proc. of the 32nd ACM/IEEE Conf. on Design Automation, Jun. 1995.*

Altmeyer et al. "Generating ECAD Framework Code from Abstract Models", Proc. of the 32nd ACM/IEEE Conf. on Design Automation, Jun. 1995, pp. 88–93.*

Moon et al. "An Object–Oriented VHDL Desgin Environment", Proc. of the 27th ACM/IEEE Design Automation Conf., pp 431–436, Jun. 1990.*

Van Rompaey et al. "CoWAre—A design Environment for Heterogeneous Hardware/Software Systems", Proc. EURO–DAC 1996, pp. 252–257, Sep. 1996.*

Bolsens et al., "Hardware/Software Co–Design of Digital Telecommunications Systems", Proceedings of the IEEE, vol. 85, Issue 3, pp. 391–418, Mar. 1997.*

Nagasmay et al., "Specificaiton, Planning and Synthesis in a VHDL Design Environment", IEEE Design & Test of Computers, vol. 9, Issue 2, pp. 58–68, Jun. 1992.*

Chao et al., "Efficient Retiming and Unfolding", IEEE Inter. Conf. on Acoustics, Speech and Signal Processing, 1993, vol. 1, pp 421–424, Apr. 1993.*

* cited by examiner

```
dfix   T_sample (8, 6);
dfix   T_acc    (8, 6);
dfix   T-bit    (1, 0, ns);
double hardwired_coef = { 0.5, 0.2, -0.3, 0.15 };

fsm correlator: :define(clk & _ck)
{
   sig_array  coef       (4,  ck,  T_sample);
   sig_array  sample     (4,  ck,  T_sample);
   sig        accu       (ck, T_accu  );
   sig        sample_in  (T_sample    );
   sig        coef_in    (T_sample    );
   sig        corr_out   (T_sample    );
   sig        load       (ck, T_bit   );
   sig        load_ctr   (T_bit       );

sfg initialize_coefs;
   for (i = 0;  i < 4; i++)
      coef[i] = W(T_sample, hardwired_coef[i] );

sfg load_coef_0;
   input(coef_in);
   coef[0] = in_coef_in;

sfg correl_1;
   accu  = cast(T_acc, coef[0] * sample[0] + coef[1] * sample[1]);

sfg correl_2;
   corr  = accu + cast(T_acc,  coef[2] * sample[2] + coef[3] * sample[3] );
   output(corr);

sfg read_sample;
   input(sample_in);
   for (i = 3; i >=0; i--)
      if (i)
         sample[i] = sample[i-1];
      else
         sample[i] = sample_in;

sfg read_control;
   input(load_ctr);
   load = load_ctr;

fsm myfsm;
   initial rst;
   state phase_1
   state phase_2
   rst    << always     << initialize_coefs   << phase1;
   phase1 << always     << read_control
                        << correl_1           << phase2;
   phase2 << !cnd(load) << correl_2
                        << read_sample        << phase1;
   phase2 << cnd(load)  << correl_2
                        << read_sample
                        << load_coef_0        << phase1;
   return mysfm;
}
```

FIG. 11

Sig Class

```
class sig {
  Value value;
  char  *name;
public:
  sig(value v);
  sig operator + (sig v);
  virtual Value simulate ();
  virtual void gen_code (ostream &os);
};

sig sig: :operator + (sig v) {
  sigadd s;
  add.left  = &v;
  add.right = this;
  return add;
}

Value sig: :simulate() {
  return value;
} sig: :gen_code (ostream &os) {
  os << name;
}
```

Derived Operator Class

```
class sigadd  :  public sig {
  sig  *left;
  sig  *right;
public:
  Value simulate();
    void gen_code (ostream &os);
};

Value sigadd: :simulate() {
  return  left->eval()  +
          right->eval();
}

Value sig: :simulate() {
  os  <<  left->cg()
  <<  " + "
  <<  right->cg();
}
```

*FIG. 16*

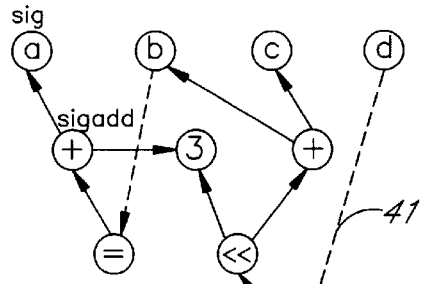
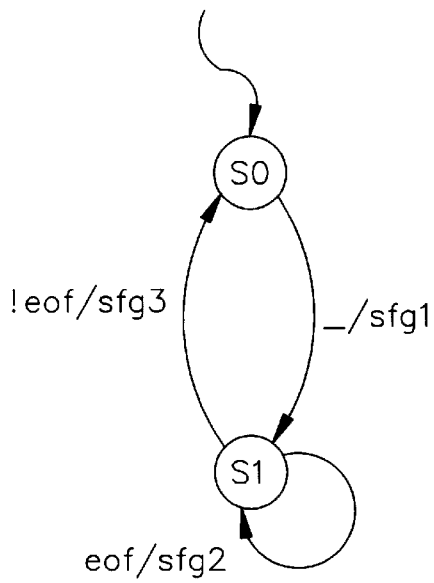
Fig. 17
Fig. 18
```
fsm f;
initial  s0;
state s1
s0  <<  allways       <<  sfg1  <<  s1;
s1  <<  cnd(eof)      <<  sfg2  <<  s1;
s1  <<  !cnd(eof)     <<  sfg3  <<  s0;
```

DESIGN ENVIRONMENT AND A METHOD FOR GENERATING AN IMPLEMENTABLE DESCRIPTION OF A DIGITAL SYSTEM

RELATED APPLICATIONS

This application claims the benefit of priority under 35 U.S.C. §120 to the following U.S. provisional patent applications: "Design Environment and a Method for Dataflow Support and Refinement of Dataflow for Hardware Design and Hardware/software Co-design," application Ser. No. 60/039,078, and filed on Mar. 14, 1997; "Design Environment and a Method for Generating an Implementable Description of a Digital System," application Ser. No. 60/039,079, and filed on Mar. 14, 1997; "Design Environment and a Method for Generating an Implementable Description of a Digital System," application Ser. No. 60/041,121, and filed on Mar. 20, 1997.

COPYRIGHTED SUBJECT MATTER

A portion of the disclosure of this patent document contains material which is subject to copyright protection. The owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention is situated in the field of design environments for digital systems, generating implementable descriptions of said system. The invention is based on object modeling and mechanisms to refine abstract descriptions to more concrete description of the system.

2. State of the Art

Currently there is a high interest in digital communication equipment for public access networks. Examples are modems for Asymmetric Digital Subscriber Loop (ADSL) applications, and up- and downstream Hybrid Fiber-Coax (HFC) communication. These modems are preferably implemented in all-digital hardware using digital signal processing (DSP) techniques. This is because of the complexity of the data processing that they require. Besides this, these systems also need short development cycles. This calls for a design methodology that starts at high level and that provides for design automation as much as possible. A more generalized view of the field of the invention reveals that in most applications where dedicated processors and other digital hardware are used, demand for new systems is rising and development time is shortening.

The most used modeling description language is VHDL (VHSIC Hardware Description Language), which has been accepted as an IEEE standard since 1987. VHDL is a programming environment that produces a description of a piece of hardware. Additions to standard VHDL can be to implement features of Object Oriented Programming Languages into VHDL. This was described in OO-VHDL (Computer, October 1995, pages 18–26).

A number of commercially available systems support the design of complex DSP systems.

MATLAB of Mathworks Inc offers the possibility of exploration at the algorithmic level. It uses the data-vector as the basic semantical feature. However, the developed MATLAB description has no relationship to a digital hardware implementation, nor does MATLAB support the synthesis of digital circuits.

SPW of Alta Group offers a toolkit for the simulation of these kind of systems. SPW is typically used to simulate data-flow semantics. Data-flow semantics define explicit algorithmic iteration, whereas data-vector semantics do not. SPW relies on an extensive library and toolkit to develop systems. Unlike MATLAB, the initial description is a block-based description. Each block used in the systems appears in two different formats, (a simulatable and a synthesizable version) which results in possible inconsistency.

COSSAP of Synopsys performs the same kind of system exploration as SPW.

DC and BC are products of Synopsys that support system synthesis. These products do not provide sufficient algorithm exploration functions.

Because all of these tools support only part of the desired functionality, contemporary systems are designed typically with a mix of these environments. For example, a designer might do algorithmic exploration in MATLAB, then do architecture definition with SPW, and finally map the architecture definition to an implementation in DC.

One primary aim of the invention is a design environment that makes it possible to design a digital systems from a data vector description to an implementable level such a VHDL. A further aim is to perform this design within the same object oriented environment. Another aim is to provide a means comprised in said design environment for simulating behaviour at any level of development.

SUMMARY OF THE INVENTION

A first aspect of the present invention concerns a design apparatus compiled on a computer environment for generating from a behavioral description of a system comprising at least one digital system part, an implementable description for said system, said behavioral description being represented on said computer environment as a first set of objects with a first set of relations therebetween, said implementable description being represented on said computer environment as a second set of objects with a second set of relations therebetween, said first and second set of objects being part of a design environment.

A behavioral description is a description which substantiates the desired behavior of a system in a formal way. In general, a behavioral description is not readily implementable since it is a high-level description, and it only describes an abstract version of the system that can be simulated. An implementable description is a more concrete description that is, in contrast to a behavioral description, detailed enough to be implemented in software to provide an approximative simulation of real-life behavior or in hardware to provide a working semiconductor circuit.

A design environment is an environment in which algorithms can be produced and run by interpretion or compilation.

An object is a data structure which shows all the characteristics of an object from an object oriented programming language, such as described in "Object Oriented Design" (G. Booch, Benjamin/Cummings Publishing, Redwood City, Calif., 1991).

Said first and second set of objects are preferably part of a single design environment. Said design environment comprises preferably an Object Oriented Programming Language (OOPL). Said OOPL can be C++.

Said design environment is preferably an open environment wherein new objects can be created. A closed environment will not provide the flexibility that can be obtained with an open environment and will limit the possibilities of the user.

Preferably, at least part of the input signals and output signals of said first set of objects are at least part of the input signals and output signals of said second set of objects. Essentially all of the input signals and output signals of said first set of objects can be essentially all of the input signals and output signals of said second set of objects.

At least part of the input signals and output signals of said behavioral description are preferably at least part of the input signals and output signals of said implementable description. Essentially all of the input signals and output signals of said behavioral description can be essentially all of the input signals and output signals of said implementable description.

Said first set of objects has preferably first semantics and said second set of objects has preferably second semantics. With semantics is meant the model of computation. Said first semantics is preferably a data-vector model and/or a data-flow model. Said second semantics is preferably a signal flow graph (SFG) data structure.

Preferably, the impact in said implementable description of at least a part of the objects of said second set of objects is essentially the same as the impact in said behavioral description of at least a part of the objects of said first set of objects.

Preferably, the impact in said implementable description of essentially all of the objects of said second set of objects is essentially the same as the impact in said behavioral description of essentially all of the objects of said first set of objects.

Impact can include not only function, but also the way the object interacts with its environment from an external point of view. A way of rephrasing this is that the same interface for providing input and collecting output is present. This does not mean that the actual implementation of the data-processing between input and output is the same. The implementation is embodied by objects, which can be completely different but perform a same function. In an OOPL, the use of methods of an object without knowing its actual implementation is referred to as information hiding.

The design apparatus preferably further comprises means for simulating the behavior of said system said means simulating the behavior of said behavioral description, said implementable description or any intermediate description therebetween. Said intermediate description can be obtained after one or several refining steps from said behavioral description.

Preferably, at least part of said second set of objects is derived from objects belonging to said first set of objects. This can be done by using the inheritance functionalities provided in an OOPL. Essentially all of said second set of objects can be derived from objects belonging to said first set of objects.

Said implementable description can be at least partly obtained by refining said behavioral description. Said implementable description can be essentially obtained by refining said behavioral description. Preferably, said refining comprises the refining of objects.

The design apparatus can further comprise means to derive said first set of objects from a vector description, preferably a MATLAB description, describing said system as a set of operations on data vectors, means for simulating statically or demand-driven scheduled dataflow on said dataflow description and/or means for clock-cycle true simulating said digital system using said dataflow description and/or one or more of said SFG data structures.

In a preferred embodiment, said implementable description is an architecture description of said system, said system advantageously further comprising means for translating said architecture description into a synthesizable description of said system, said synthesizable description being directly implementable in hardware. Said synthesizable description is preferably a netlist of hardware building blocks. Said hardware is preferably a semiconductor chip or a electronic circuit comprising semiconductor chips.

A synthesizable description is a description of the architecture of a semiconductor that can be synthesized without further processing of the description. An example is a VHDL description.

Said means for translating said architecture description into a synthesizable description can be Cathedral-3 or Synopsys DC.

A second aspect of the present invention is a method for designing a system comprising at least one digital part, comprising a refining step wherein a behavioral description of said system is transformed into an implementable description of said system, said behavioral description being represented as a first set of objects with a first set of relations therebetween and said implementable description being represented as a second set of objects with a second set of relations therebetween.

Said refining step preferably comprises translating behavioral characteristics at least partly into structural characteristics. Said refining step can comprise translating behavioral characteristics completely into structural characteristics.

Said method can further comprise a simulation step in which the behavior of said behavioral description, said implementable description and/or any intermediate description therebetween is simulated.

Said refining step can comprises the addition of new objects, permitting interaction with existing objects, and adjustments to said existing objects allowing said interaction.

Preferably, said refining step is performed in an open environment and comprises expansion of existing objects. Expansion of existing objects can include the addition to an object of methods that create new objects. Said object is said to be expanded with the new objects. The use of expandable objects allows to use meta-code generation: creating expandable objects implies an indirect creation of the new objects.

Said behavioral description and said implementable description are preferably represented in a single design environment, said single design environment advantageously being an Object Oriented Programming Language, preferably C++.

Preferably, said first set of objects has first semantics and said second set of objects has second semantics. Said first semantics is preferably a data-vector model and/or a data-flow model. Said second semantics is preferably an SFG data structure.

The refining step comprises preferably a first refining step wherein said behavioral description being a data-vector model is at least partly transformed into a data-flow model. Advantageously, said data-flow model is an untimed floating point data-flow model.

Said refining step preferably further comprises a second refining step wherein said data-flow model is at least partly transformed into an SFG model. Said data-flow model can be completely transformed into an SFG model.

In a preferred embodiment, said first refining step comprises the steps of determining the input vector lengths of input, output and intermediate signals, determining the amount of parallelism of operations that process input signals to output signals, determination of actors, edges and tokens of said data-flow model, and determining the wordlength of said tokens. Said step of determining the amount of parallelism can preferably comprises determining the amount of parallelism for every data vector and reducing the unspecified communication bandwidth of said data-vector model to a fixed number of communication buses in said dataflow model. Said step of determination of actors, edges and tokens of said data-flow model preferably comprises defining one or a group of data vectors in said first data-vector model as actors; defining data precedences crossing actor bounds, as edges, said edges behaving like queues and transporting tokens between actors; construct a system schedule and run a simulation on a computer environment.

Said second refining step comprises preferably transforming said tokens from floating point to fixed point.

Preferably, said SFG model is a timed fixed point SFG model.

Said second set of objects with said second set of relations therebetween are preferably at least partly derived from said first set of objects with said first set of relations therebetween.

Objects belonging to said second set of objects are preferably new objects, identical with and/or derived by inheritance from objects from said first set of objects, or a combination thereof.

Several of said SFG models can be combined with a finite state machine description resulting in an implementable description.

Said implementable description can be transformed to synthesizable code, said synthesizable code preferably being VHDL code.

Another aspect of the present invention is a method for simulating a system, wherein a description of a system is transformed into compilable C++ code. Preferably, said description is an SFG data structure and said compilable C++ code is used to perform clock cycle true simulations.

Several SFG data structures can be combined with a finite state machine description resulting in an implementable description, said implementable description being said compilable C++ code suitable for simulating said system as software.

Another aspect of the present invention uses one or more SFG data structures. Said Clock-cycle true simulation can be an expectation-based simulation, said expectation-based simulation comprising the steps of: annotating a token age to every token; annotating a queue age to every queue; increasing token age according to the token aging rules and with the travel delay for every queue that has transported the token; increasing queue age with the iteration time of the actor steering the queue, and; checking whether token age is never smaller than queue age throughout the simulation.

Another aspect of the present invention is a hardware circuit or a software simulation of a hardware circuit designed with the design apparatus as recited higher.

Another aspect of the present invention is a hardware circuit or a software simulation of a hardware circuit designed with the method as recited higher.

BRIEF DESCRIPTION OF THE DRAWINGS

In FIG. 11, the code in OCAPI for a correlator processor is given.

In FIG. 16, the use of overloading to construct the signal flowgraph data structure is shown.

In FIG. 17, an example C++ code fragment and its corresponding data structure is described.

In FIG. 18, a graphical and C++-textual description of the same FSM is shown.

DETAILED DESCRIPTION OF THE INVENTION

Figure 1:
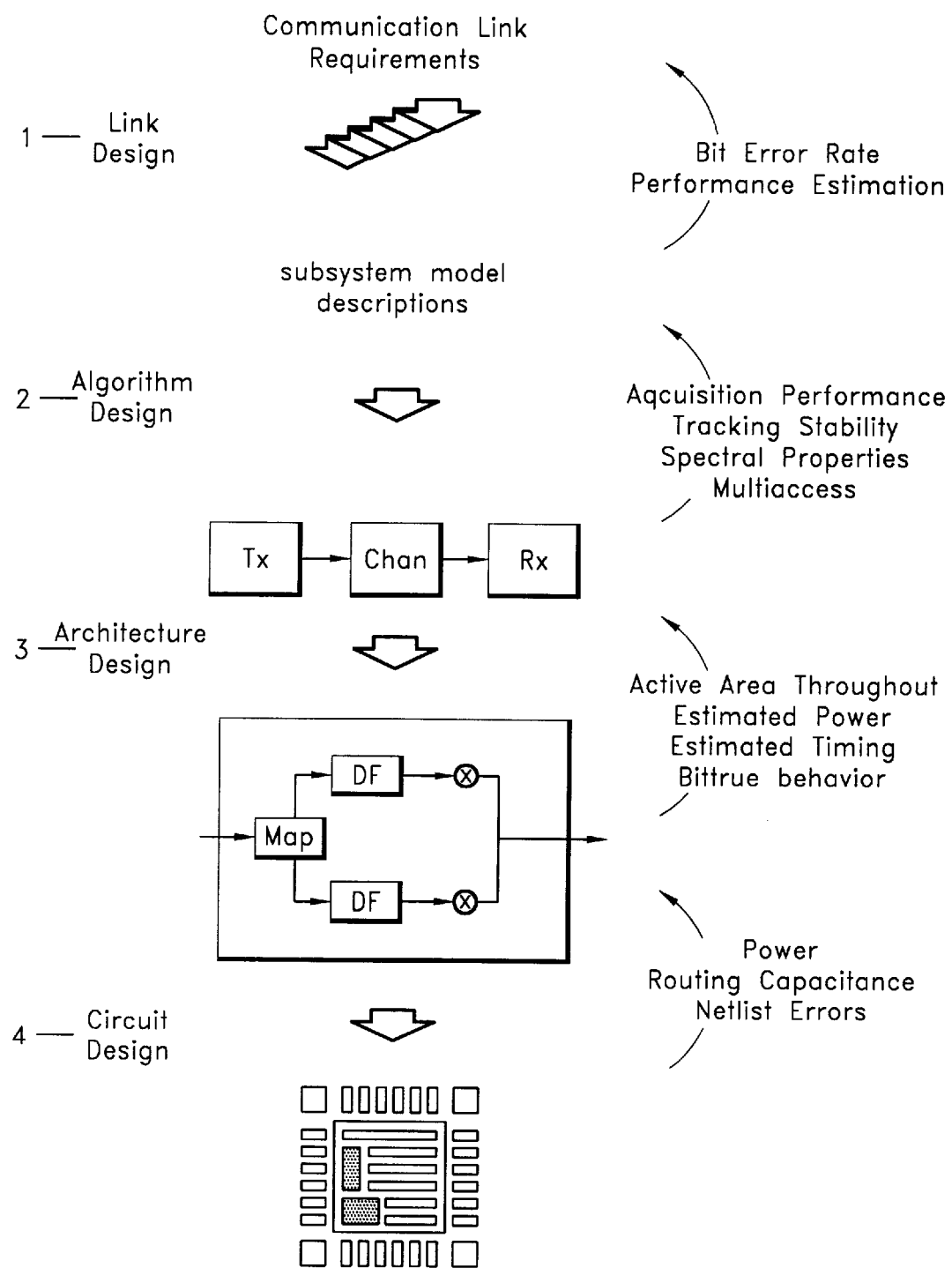
In FIG. 1, the overall development methodology is described.

The present invention will be further explained by means of examples, which does not limit the scope of the invention as claimed.

EXAMPLE 1

The present invention can be described as a design environment for performing subsequent gradual refinement of descriptions of digital systems within one and the same object oriented programming language environment. The lowest level is semantically equivalent to a behavioral description at the register transfer (RT) level. This way, combined semantic and syntactic translations in the design flow are avoided.

A preferred embodiment of the invention comprising the design method according to the invention is called OCAPI. It includes both a design environment in an object oriented programming language and a design method. OCAPI differentiates from current systems that support architecture definition (SPW, COSSAP) in the way a designer is guided from the MATLAB level to the register transfer level.

the designer is offered a single coding framework in an object oriented programming language, such as C++, to express refinements to the behavior. An open environment is used, rather than the usual interface-and-module approach.

The coding framework is a container of design concepts, used in traditional design practice. Some example design concepts currently supported are simulation queues, finite state machines, signal flowgraphs, hybrid floating/fixed point data types, operation profiling and signal range statistics. The concepts take the form of object oriented programming language objects (referred to as object in the remainder of this text), that can be instantiated and related to each other.

with this set of objects, a gradual refinement design route is offered: more abstract design concepts can be replaced with more detailed ones in a gradual way. Also, design concepts are combined in an orthogonal way: quantization effects and clock cycles (operation/operator mapping) for instance are two architecture features that can be investigated separately. Next, the different design hierarchies can be freely intermixed because of this object-oriented approach. For instance, it is possible to simulate half of the description at fixed point level, while the other half is still in floating point.

The use of a single object oriented programming language framework in OCAPI allows fast design iteration, which is not possible in the typical nowadays hybrid approach.

Comparing to existing dataflow-based systems like SPW and COSSAP we see that the algorithm iterations can be freely chosen. Comparing to existing hardware design environments like DC or BC, we see that we can start from a specification level that is more abstract than the connection of blocks.

Two new concepts introduced are scaleable parallelism and expectation based simulation. The designer is given an environment to check the feasibility of what the designer thinks that can be done. In the development process, the designer creates his library of Signal FlowGraph (SFG) versions of abstract MATLAB operations.

In the design of a telecommunication system (FIG. 1), we distinguish four phases: link design, algorithm design, architecture design and circuit design. These phases are used to define and model the three key components of a communication system: a transmitter, a channel model, and a receiver.

The link design (1) is the requirement capture phase. Based on telecommunication properties such as transmission bandwidth, power, and data throughput (the link requirements), the system design space is explored using small subsystem simulations. The design space includes all algorithms which can be used by a transmitter/receiver pair to meet the link requirements. Out of receiver and transmitter algorithms with an identical functionality, those with minimal complexity are preferred. Besides this exploration, any expected transmission impairment must also be modeled into a software channel model.

The algorithm design (2) phase selects and interconnects the algorithms identified in the link design phase. The output is a software algorithmic description in C++ of digital transmitter and receiver parts in terms of floating point operations. To express parallelism in the transmitter and receiver algorithms, a data-flow data model is used. Also, the transmission imperfections introduced by analog parts such as the RF front-ends are annotated to the channel model.

The architecture design (3) refines the data model of the transmitter or receiver. The target architectural style is optimized for high speed execution, uses distributed control semantics and pipeline mechanisms. The resulting description is a fixed point, cycle true C++ description of the algorithms in terms of execution on bit-parallel operators. The architecture design is finished with a translation of this description to synthesizable VHDL.

Finally, circuit design (4) refines the bit-parallel implementation to circuit level, including technology binding, the introduction of test hardware, and design rule checks.

Target Architecture

Figure 2:
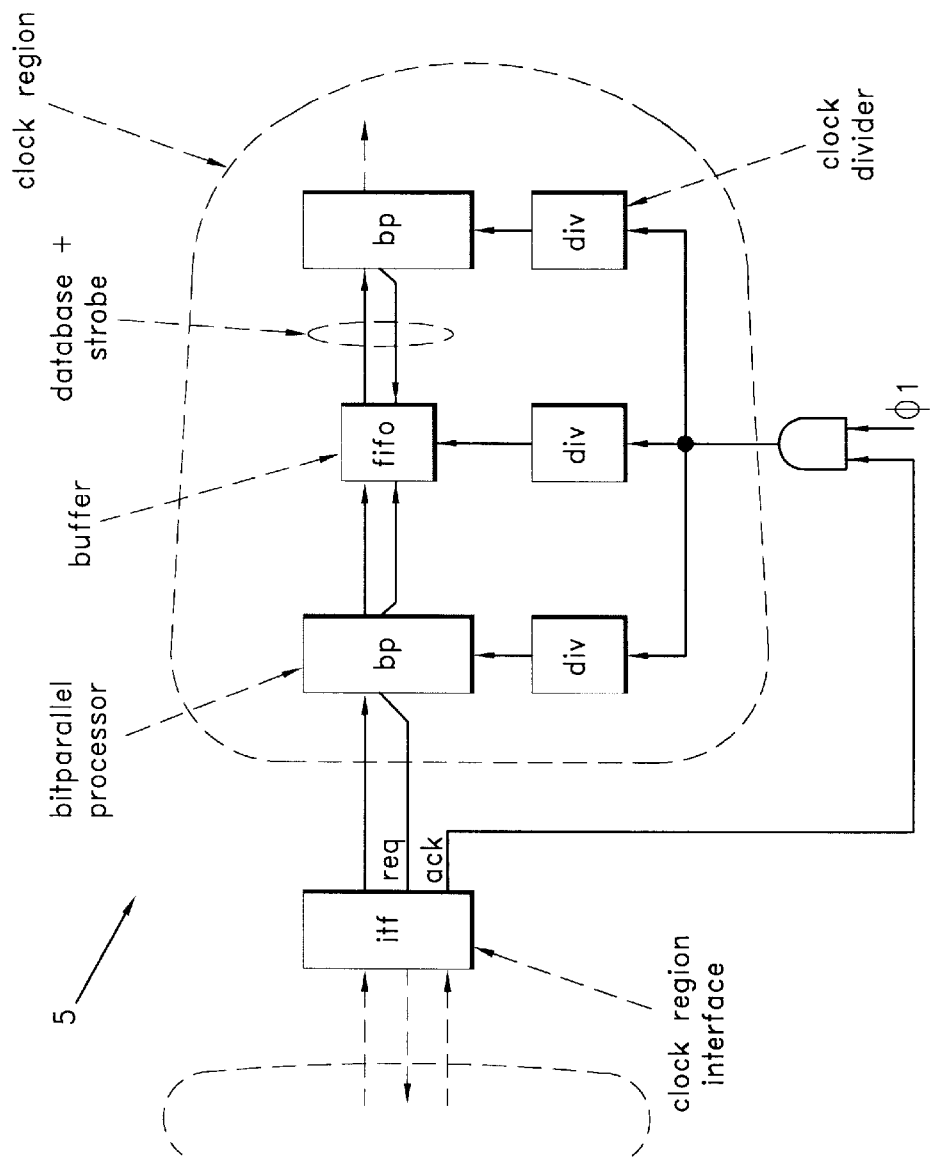
In FIG. 2, the targeted architecture is described.

The target architecture (5), shown in FIG. 2, consists of a network of interconnected application specific processors. Each processor is made up of bit-parallel data-paths. When hardware sharing is applied, also a local control component is needed to perform instruction sequencing. The processors are obtained by behavioral synthesis tools or RT level synthesis tools. In either case, circuits with a low amount of hardware sharing are targeted. The network is steered by one or multiple clocks. Each clock signal defines a clock region. Inside a clock region the phase relations between all register clocks are manifest. Clock division circuits are used to derive the appropriate clock for each processor.

In between each processor, a hardware queue is present to transport data signals. They increase parallelism inside a clock region and maintain consistency between different streams of data arriving at one processor.

Across clock region boundaries, synchronization interfaces are used. These interfaces detect the presence of data at the clock region boundary and gate clock signals for the clock region that they feed. This way, non-manifest and variable data rates in between clock regions are supported.

The ensemble of clock dividers and handshake circuits forms a parallel scheduler in hardware, synchronizing the processes running on the bit-parallel processor.

Overview of the C++ Modeling Levels

Figure 3:
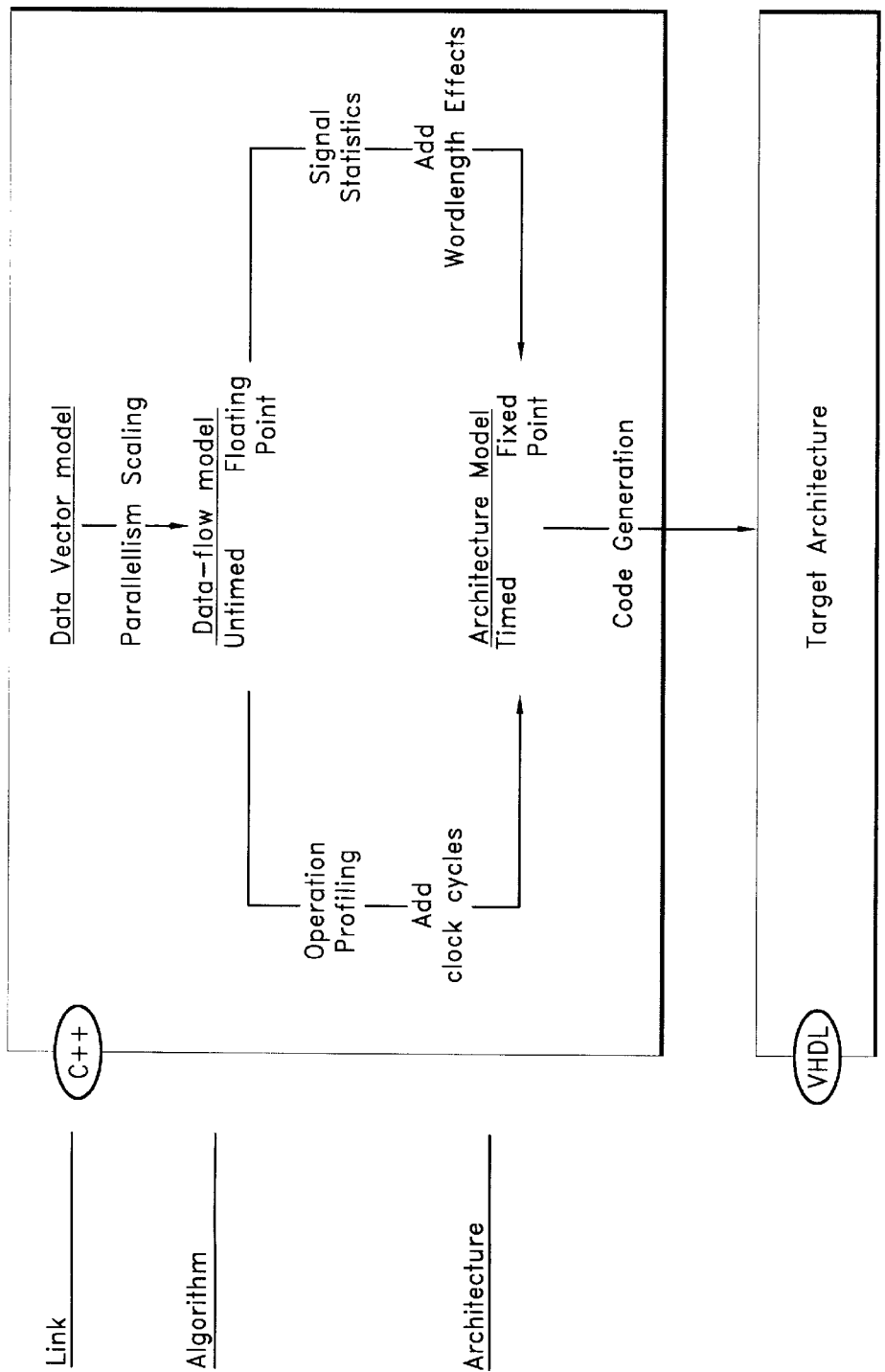
In FIG. 3, the C++ modeling levels are depicted.

An overview of the distinct C++ modeling levels used by OCAPI is given in FIG. 3. The C++ modeling spans three subsequent levels in the design flow: the link level, the algorithm level and the architecture level. The transition to the last level, the circuit level, is made by automated means trough code generation. Usually, VHDL is used as the design language in this lowest level.

The link level is available through data-vector modeling. Using a design mechanism called parallelism scaling, this level is refined to the algorithm level. The algorithm level uses data-flow semantics. Using two distinct refining mechanisms in the data-flow level, we can refine this level to a register transfer level.

The two refining mechanisms are clock cycle true modeling and fixed point modeling. Clock cycle true modeling is achieved by allocating cycle budgets and operators for each algorithm. To help the designer in this decision, operation profiling is foreseen. Fixed point modeling restricts the dynamic range of variables in the algorithms to a range for which a hardware operator can be devised. Signal statistics are returned by the design to help the designer with this.

The last level, the architecture model, uses a signal flowgraph to provide a behavioral description. Using this description synthesizable code is generated. The resulting code then can be mapped onto gates using a register-transfer design tool such as DC of Synopsys.

Data-vector Modeling

The upper level of representation of a communication system is the link level. It has the following properties:

It uses pure mathematical manipulation of functions. Time is explicitly manipulated and results in irregular-flow descriptions.

It uses abstraction of all telecommunication aspects that are not relevant to the problem at hand.

In this representation level, MATLAB is used for simulation. MATLAB uses the data-vector as the basic data object. To represent time functions in MATLAB, they are sampled at an appropriate rate. Time is present as one of the many vector dimensions. For example, the MATLAB vector addition a=b+c;

can mean both sequential addition in time (if the b and c vectors are thought of as time-sequential), or parallel addition (if b and c happen to be defined at one moment in time). MATLAB simply make no distinction between these two cases.

Besides this time-space feature, MATLAB has a lot of other properties that makes it the tool-of-choice within this design level:

The ease with which irregular flow of data is expressed with vector operations. For example, the operation max(vector), or std(vector).

The flexibility of operations. A maximum operation on a vector of 10 elements or 1000 elements looks identically: max(vector).

The interactivity of the tool, and the transparency of data object management.

The extended library of operations, that allow very dense description of functionality.

Graphics and simulation speed.

This data-vector restriction is to be refined to a data-flow graph representation of the system. Definition of the data-flow graph requires definition of all actors in the graph (actor contents as well as actor firing rules) and definition of the graph layout.

In order to design systems effectively with the OCAPI design flow, a smooth transition between the data-vector level and the data-flow level is needed. A script to perform this task is constructed as can be seen in the following example.

EXAMPLE 1

Initial Data-Vector Description

We consider a pseudonoise (PN) code correlator inside a direct sequence spread-spectrum (DS/SS) modem as an example.

% input data
  in=[1 2 1 3 3 4 1 2];
% spreading code
  c=[1 −1 1 −1];
% correlate
  ot=corr (in, c)
% find correlation peak
  [max, maxpos]=max (ot);

A vector of input data in is defined containing 8 elements. These are subsequent samples taken from the chip demodulator in the spread spectrum modem. The dimension of in thus corresponds to the time dimension. The input vector in is in principle infinite in length. For simulation purposes, it is restricted to a data set which has the same average properties (distribution) as the expected received data.

The samples of in are correlated with the PN-code vector of length 4, c. The output vector ot thus contains 5 samples, corresponding to the five positions of in at which c can be aligned to. The max function locates the maximum value and position inside the correlated data. The position maxpos is subsequently used to synchronize the PN-code vector with the incoming data and thus is the desired output value of the algorithm.

This code is an elegant and compact specification, yet it offers some open questions for the PN-correlator designer:

The algorithm has an implicit startup-effect. The first correlation value can only be evaluated after 4 input samples are available. From then on, each input sample yields an additional correlation value.

The algorithm misses the common algorithmic iteration found in digital signal processing applications: each statement is executed only once.

For the implementation, no statement is made regarding the available cycle budget. This is however an important specification for the attainable acquisition speed of the modem.

All of these questions are caused by the parallelism of the data-vector description.

We now propose a way to make the parallelism of the operations more visible. Each of the MATLAB operations is easily interpreted. Inside the MATLAB simulation, the length of the operands will first be determined in order to select the correct operation behavior. For example,

[max, maxpos]=max(ot)

determines the maximum on a vector of length 5 (which is the length of the operand ot). It needs at least 4 scalar comparisons to evaluate the result. If ot would for example have a longer length, more scalar comparisons would be needed. To indicate this in the description, we explicitly annotate each specific instance of the generic operations with the length of the input vectors.

% input data
  in=[1 2 1 3 3 4 1 2];
% spreading code
  c=[1 −1 1 −1];
  4
% correlate
  ot=corr (in, c)
    5 8,4
% find correlation peak
  [max, maxpos]=max (ot);
    1 5

This little annotation helps us to see the complexity of the operations more clearly. We will use this when considering implementation of the description in hardware. It is of course not the intention to force a user to do this (MATLAB does this already for him/her).

When thinking about the implementation of this correlator, one can imagine different realizations each having a different amount of parallelism, that is, the mapping of all the operations inside corr( ) and max( ) onto a time/space axis. This is the topic of the next section.

Scaled Description

Consider again the definition of the PN code, as in:

% spreading code
c=[1 −1 1 −1];
4

This MATLAB description defines the variable c to be a data-vector containing 4 different values. This vector assignment corresponds to 4 concurrent scalar assignments. We therefore say that the maximal attainable parallelism in this statement is 4.

In order to achieve this parallelism in the implementation, there must be hardware available to perform 4 concurrent scalar assignments. Since a scalar assignment in hardware corresponds to driving a data bus to a certain state, we need 4 busses in the maximal parallel implementation. If only one bus would be desired, then we would have to indicate this. For each of the statements inside the MATLAB description, a similar story can be constructed. The indication of the amount of parallelism is an essential step in the transition from data-vectors to data-flow. We call this the scaling of parallelism. It involves a restriction of the unspecified communication bandwidth in the MATLAB description to a fixed number of communication busses. It is indicated as follows in the MATLAB description.

% input data
in=[1 2 1 3 3 4 1 2];
8@1
% spreading code
c=[1 −1 1 −1];
4@4
% correlate
ot=corr (in, c)
5@8,4
% find correlation peak
[max, maxpos]=max (ot);
1@1 5

As is seen, each assignment is extended with a @i annotation, that indicates how the parallelism in the data vectors is ordened onto a time axis. For example, the 8 input values inside in are provided sequentially by writing 8@1. The 4 values of c on the other hand, are provided concurrently. We see that, whatever implementation of the corr operation we might use, at least 8 iterations will be required, simply to provide the data to the operation.

At this moment, the description is getting closer to the data-flow level, that uses explicit iteration. One more step is required to get to the data flow graph level. This is the topic of the next section.

Data Flow Graph Definition

In order to obtain a graph, the actors and edges inside this graph must be defined. Inside the annotated MATLAB description, data precedences are already present through the presence of the names of the vectors. The only thing that is missing is the definition of actor boundaries; edges will then be defined automatically by the data precedences going across the actor boundaries.

This can be done by a new annotation to the MATLAB description. Three actors will be defined in the DS/SS correlator.

actor1 {
% input data
in=[1 2 1 3 3 4 1 2];
8@1
}
actor2 {
% spreading code
c=[1 −1 1 −1];
4@4
% correlate
ot=corr (in, c)
5@1 8,4
}
actor3 {
% find correlation peak
[max, maxpos]=max (ot);
1@1 5
}

Again the annotation should be seen as purely conceptual; it is not intended for the user to write this code. Given these annotations, a data flow graph can be extracted from the scaled MATLAB description in an unambiguous way.

actor1 is an actor with no input, and one output, called in.

actor2 is an actor with 1 input in and one output ot.

actor3 is an actor with 1 input ot and outputs maxpos and max.

Furthermore, the simulation uses queues to transport signals in between the actors. We need three queues, called in, ot and maxpos.

Figure 4:
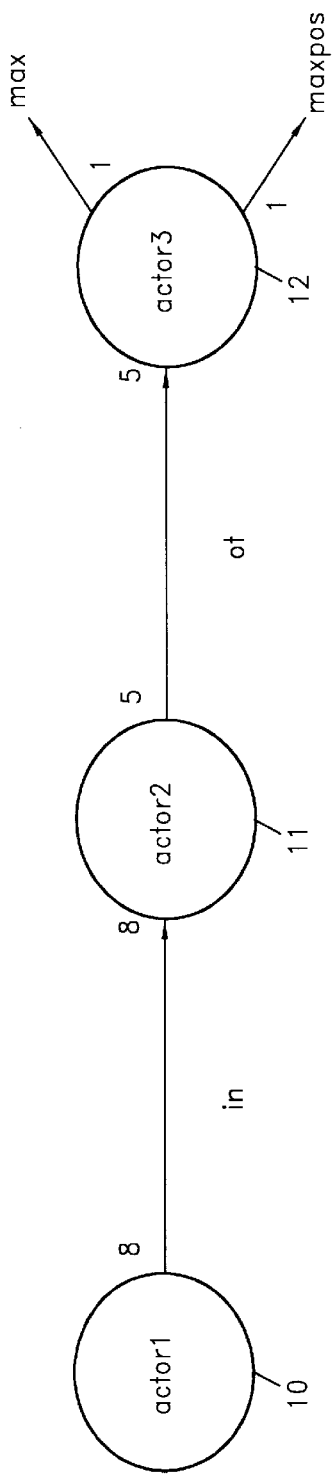
In FIG. 4, an SDF model of the PN correlator is shown.

The missing piece of information for simulation of this dataflow graph are the firing rules (or equivalently the definition of productions and consumptions on each edge). A naive data flow model is shown in FIG. 4: actor1 (10) produces 8 values, which are correlated by actor2 (11), while the maximum is selected inside actor3 (12).

This would however mask the parallelism scaling operation inside the MATLAB description. For example, it was chosen to provide the 8 values of the in vector in a sequential way over a parallel bus. It is believed that the multi-rate SDF model therefore is not a good container for the annotated MATLAB description.

Figure 5:
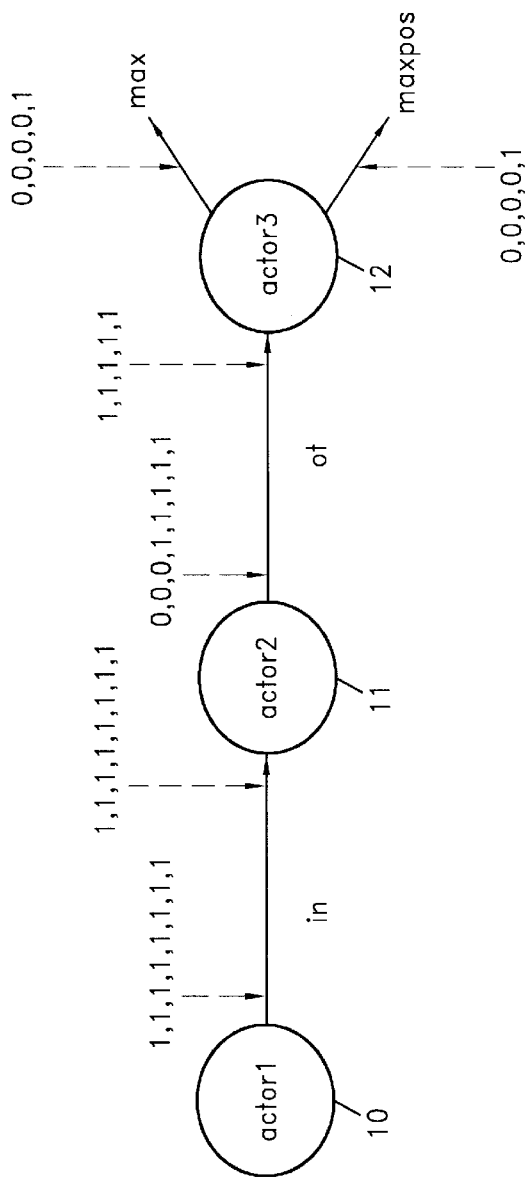
In FIG. 5, a CSDF model of the PN correlator is described.

Another approach is a cyclostatic description. In this case we have a graph as in FIG. 5.

We see that the determination of production patterns involves examining the latencies of operations internal to the actor. This increases the complexity of the design script. It is simpler to perform a demand driven scheduling of all actors. The firing rule only has to examine the availability of input tokens.

Figure 6:
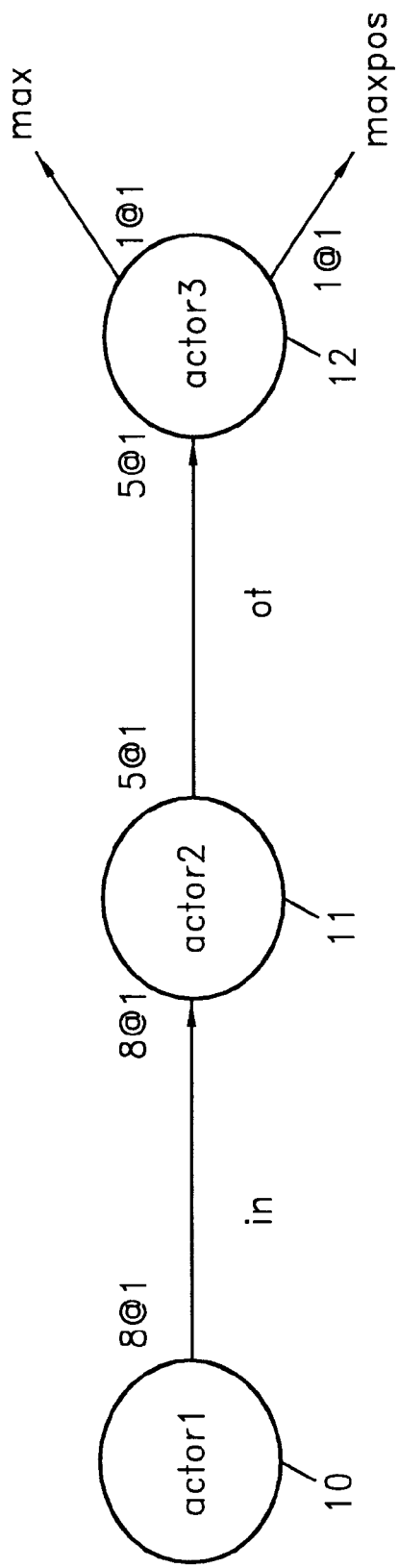
In FIG. 6, a MATLAB Dataflow model of the PN correlator is shown.

The desired dataflow format as in FIG. 6 is thus situated in between the multirate SDF level and the cyclostatic SDF level. It is proposed to annotate consumptions and productions in the same way as it was written down in the matlab description:

8@1 is the production of actor1. It means: 8 samples are produced one at a time.

8@1 and 5@1 is the consumption and production of actor2 respectively.

5@1 and 1@1, 1@1 are the consumption and productions for actor3.

Data-Flow Simulation

Given an annotated matlab description, a simulation can now be constructed by writing a high-level model for each actor, interconnecting these with queues and constructing a system schedule. OCAPI provides both a static scheduler and a demand-driven scheduler. Out of this simulation, several statistics are gathered:

On each queue, put and get counts are observed, as well as signal statistics (minimum and maximum values). The signal statistics provide an idea of the required buswidths of communication busses.

The scheduler counts the firings per actor, and operation executions (+, −, *, . . .) per actor. This profiling helps the designer in deciding cycle budgets and hardware operator allocation for each actor.

These statistics are gathered through a C++ operator overloading mechanism, so the designer gets them for free if he uses the appropriate C++ objects (schedule, queue and token class types) for simulation.

We are next interested in the detailed clock-cycle true behavior of the actors and the required storage and handshake protocol circuits on the communication busses. This is the topic of the next step, the actor definition.

Actor Definition

The actor definition is based on two elements:

Signal-flowgraph representation of behavior.

Time-verification of the system.

The two problems can be solved independently using the annotated MATLAB code as specification. In OCAPI:

The actor RT modeling proceeds in C++ and can be freely intermixed with high level descriptions regarding both operator wordlength effects and clock-cycle true timing.

The time-verification approach allows the system feasibility to be checked at all times by warning the designer for deadlock and/or causality violations of the communication.

Signal Flowgraph Definition

Within the OCAPI design flow, a class library was developed to simulate behavior at RT-level. It allows To express the behavior of an algorithm with arbitrary implementation parallelism by setting up an signal flow graph (SFG) data structure.

To simulate the behavior of an actor at a clock-cycle true level by interpreting this SFG data structure with instantiated token values.

To specify wordlength characteristics of operations regarding sign, overflow and rounding behavior. Through explicit modeling of the quantization characteristic rather than the bit-vector representation (as in SPW), efficient simulation runtimes are obtained.

To generate C++ code for this actor, and hence perform the clock cycle true simulation with compiled code.

To generate VHDL code for this actor, and synthesize an implementation with Synopsys DC.

To generate DSFG code for this actor, and synthesize an implementation with Cathedral-3. It was observed that Cathedral-3 performs a better job with relation to both critical path and area of the obtained circuits than Synopsys DC. The best synthesis results are obtained by first using Cathedral-3 to generate a circuit at gate level and then Synopsys-DC to perform additional logic optimization as a postprocessing.

An important observation was made regarding simulation speed. For equivalent descriptions at different granularities, the following relative runtimes were found:

1 for the MATLAB simulation.

2 for the untimed, high level C++ data flow description.

4 for the timed, fixed point C++ description (compiled code).

40 for the procedural, word-level VHDL description.

It is thus concluded that RT-modeling of systems within OCAPI is possible within half an order of magnitude of the highest level of description. VHDL modeling however, is much slower. Currently the figure of 40 times MATLAB is even considered an under-estimate. Future clock-cycle based VHDL simulators can only solve half of this problem, since they still use bit-vector based simulation of tokens rather then quantization based simulation.

Figure 7:
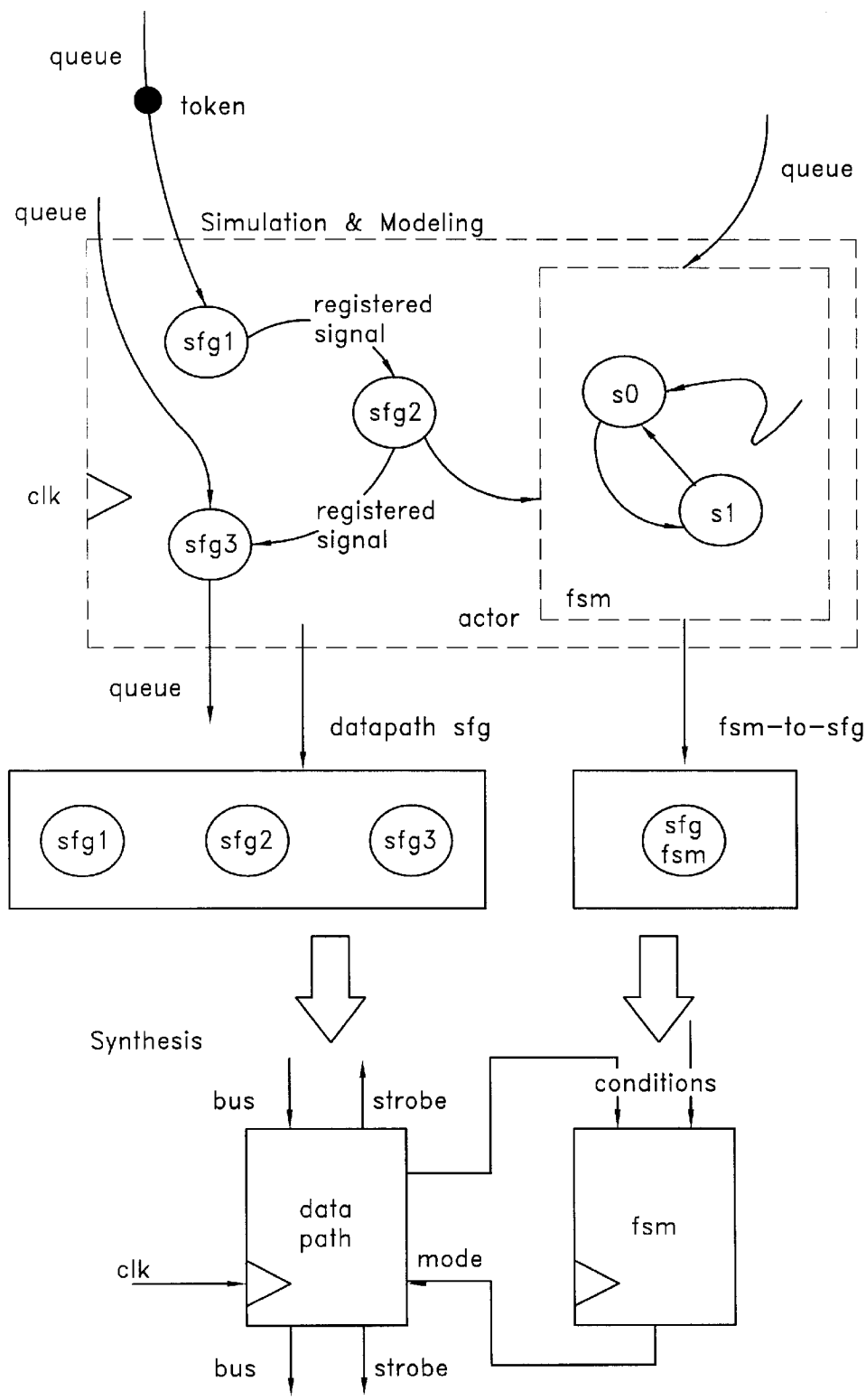
In FIG. 7, the SFG modeling concepts are depicted.

Next, the modeling issues in C++ are shown in more detail. The C++ signal-flowgraph representation uses a signal data-type, that can be either a registered or else an immediate value. With this data-type, expressions are formed using the conventional scalar operations. (+, −, *, shifts and logical operations). Expressions are grouped together in a signal flowgraph. A signal flowgraph interfaces with the system through the data-flow simulation queues. Several signal-flowgraphs can be grouped together to a SFG-sequence. A SFG sequence is an expression of behavior that spans several cycles. The specification is done through a finite state machine model, for which transition conditions can be expressed. The concept of SFG modeling is pictured in FIG. 7.

The combination of different SFG's in combination with a finite state machine make up the clock-cycle true actor model. Within the actor, SFG communication proceeds through registered signals. Communication over the boundaries of an actor proceeds through simulation queues.

When the actor is specified in this way, and all signal wordlengths are annotated to the description, an automated path to synthesis is available. Several different SFG's can be assigned to one datapath. Synthesizable code is generated in such a way that hardware sharing between different sfg's is possible. A finite state machine (FSM) description is first translated to SFG format to generate synthesizable code in the same way. There is an implicit hierarchy available with this method: by assigning different FSM-SFG's to one datapath, an overall processor architecture is obtained that again has a mode port and therefore looks like a (multicycle) datapath. For macro control problems (such as acquisition/ tracking algorithm switching in modems), this is a necessity.

Although the distance between the annotated MATLAB level and this RT-level SFG seems large, it is reasonable on the actor level. Consider for example

```
actor3 {
  % find correlation peak
    [max, maxpos]=max (ot);
      1@1 5
}
```

We are asked here to write time the max( ) operation with an SFG. actor2 has scaled the parallelism of ot to 5@1.

A solution is presented in actual C++ code.

```
{
FB qin("qin"); //input queue
FB q1out("qout"); //output queue
FB q2out("qout"); //output queue
FB start("start"); //the start pin of the
  processor
clock ck;
_sig currmax(ck,dfix(0); //registry holding current
  maximum
```

```
_sig maxpos(ck,dfix(0)); //registry holding position
   of max
_sig currpos(ck,dfix(0)); //current position
_sig inputvalue; //holds input values
_sig maxout;
_sig maxposout;
_sig one(dfix(1)); //a constant
SFG sfg0, sfg1, sfg2; //we use 3 sfg's
sfg0.starts( ); //code after this is for sfg0
currmax=inputvalue;
maxpos=one;
currpos=one;
   //next, give sfg0 a mode and
   an input queue
sfg0<<"m0"<<ip(inputvalue,qin);
sfg1.starts( ); //code after this is for sfg1
   //this is a conditional
   assignment
currmax=(inputvalue>currmax).cassign(inputvalue,
   currmax);
maxpos=(inputvalue>currmax).cassign(currpos,
   maxpos);
currpos=currpos+1;
sfg1<<"m1"<<ip(inputvalue,qin);
sfg2.starts( ); //the last SFG
maxposout=(inputvalue>currmax).cassign(_sig(dfix(4)),
   maxpos);
maxout=(inputvalue>currmax).cassign(inputvalue,
   currmax);
sfg2<<"m2"<<op(maxout,qout)<<op(maxposout,q2out);
state s0("s0"), s1("s1"), s2("s2"), s3("s3")
s0>>!cnd(start)>>s0;
s0>>cnd(start)>>sfg0s1;
s1>>allways>>sfg1>>s2;
s2>>allways>>sfg1>>s3;
s3>>allways>>sfg2>>s0;
}
```

Figure 8:
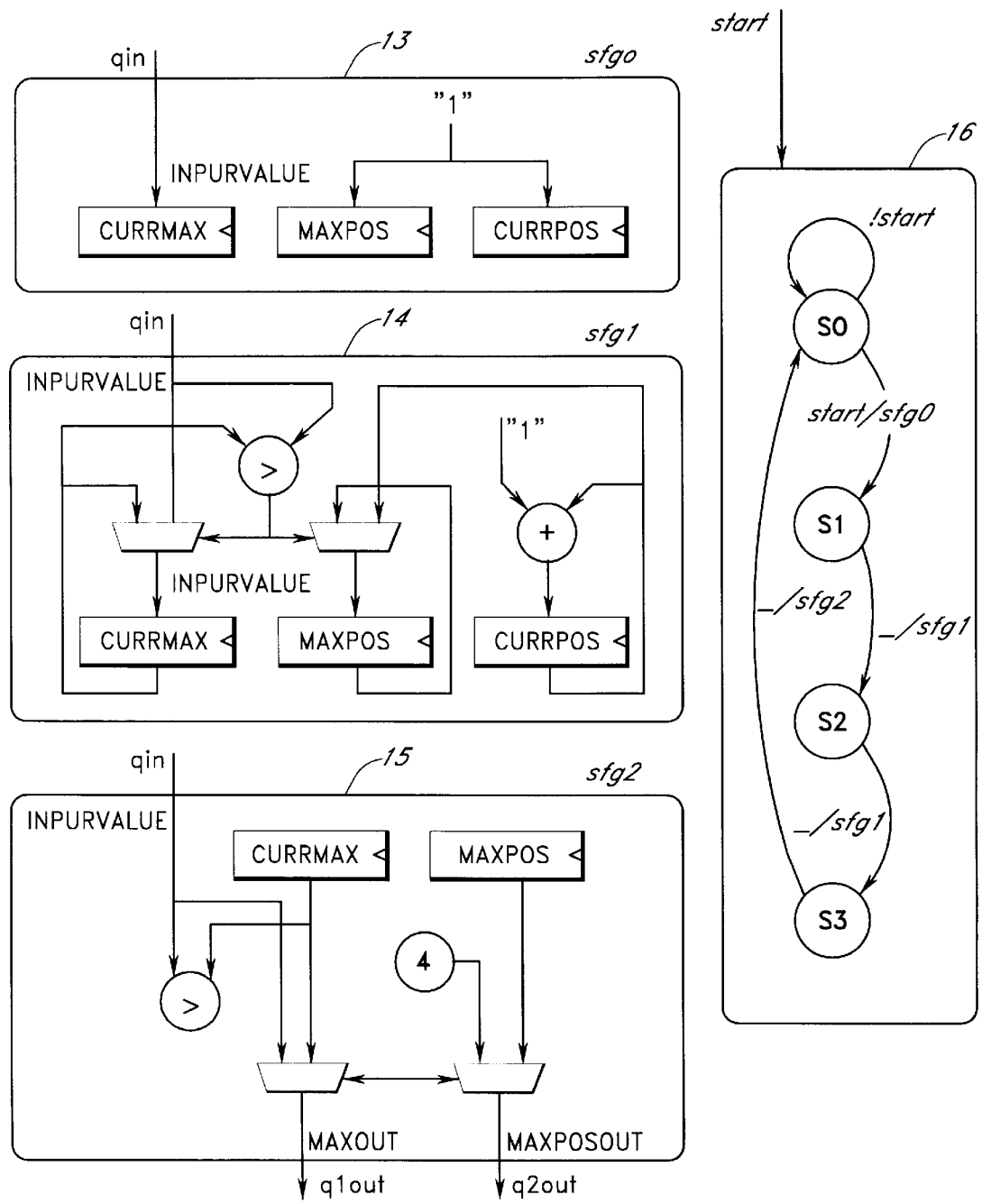
In FIG. 8, the implied description of the max actor is described.

As an aid to interpret the C++ code, the equivalent behavior is shown in FIG. 8. The behavior is modeled as a 4-cycle description. Three SFG's (13,14,15) are needed, in addition to a 4-state controller (16). The controller is modeled as a Mealy machine.

The C++ description also illustrates some of the main contributions of OCAPI: register-transfer level aspects (signals, clocks, registers), as well as dataflow aspects simulation queues) are freely intermixed and used as appropriate. By making use of C++ operator overloading and classes, these different design concepts are represented in a compact syntax format. Compactness is a major design issue.

Having this specification, we have all information to proceed with the detailed architectural design of the actor. This is however only part of the system design solution: we are also interested in how to incorporate the cycle-true result in the overall system.

Time Verification

The introduction of time (clock cycles) in the simulation uses an expectation-based approach. It allows to use either a high level or else an SFG-type description of the actor, and simulate the complete system clock-cycle true. The simulation helps the designer in finding whether his 'high-level' description matches the SFG description, and secondly, whether the system is realizable.

Figure 10:
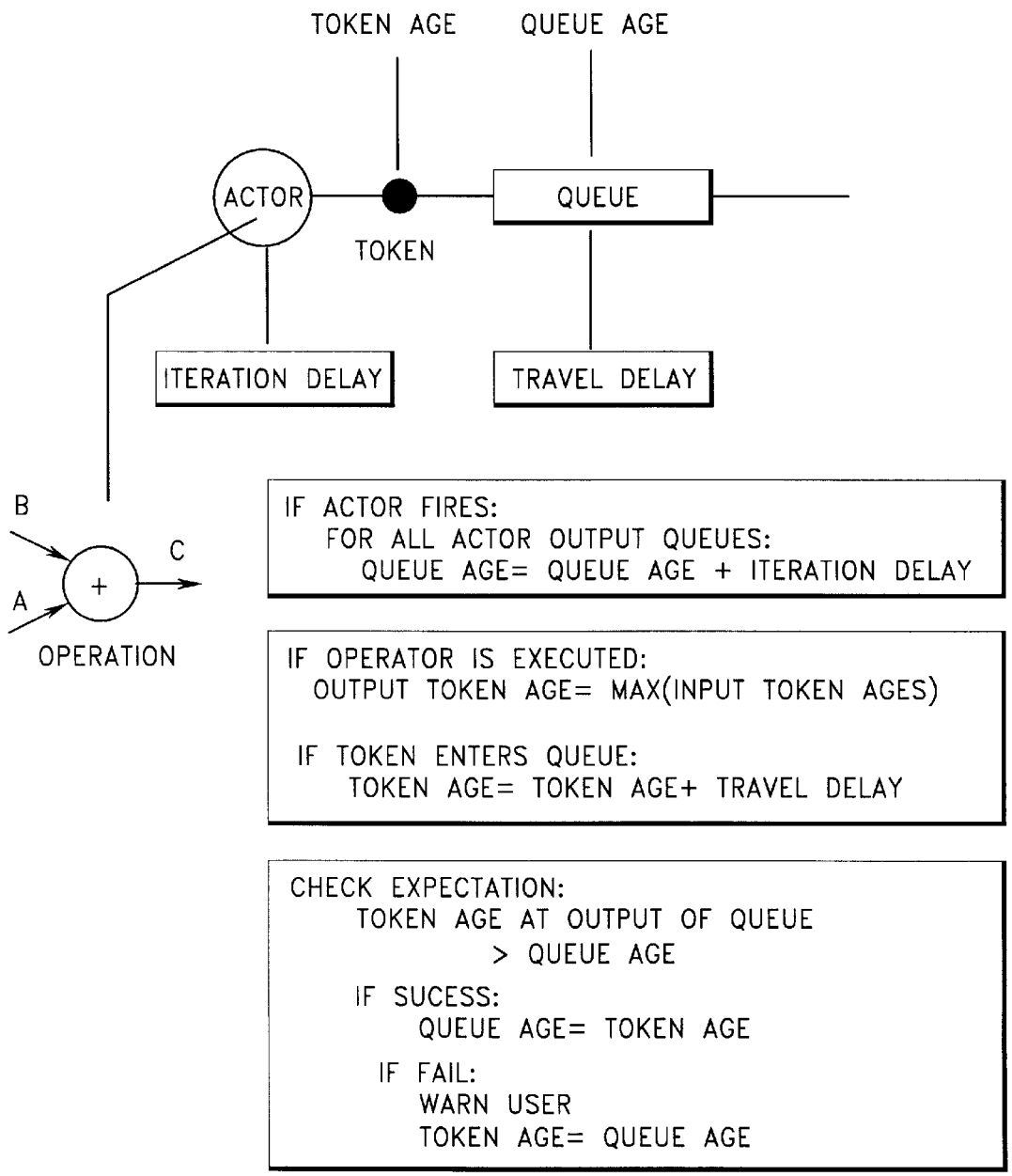
In FIG. 10, an overview of expectation based simulation is shown.

A summary of the expectation based simulation is given in FIG. 10 and is used to illustrate the ideas mentioned below.

This is a different approach then when analysis is used (e.g. the evaluation of a compile-time schedule and token lifetimes) to force restrictions onto the actor implementation. This traditional approach gives the designer no clue on whether he is actually writing down a reasonable description.

Each token in the simulation is annotated with a time when it is created: the token age. Initial tokens are born at age 0, and grow older as they proceed through the dataflow graph. The unit of time is the clock cycle.

Additionally, each queue in the simulation holds a queue age (say, 'the present') that is used to check the causality of the simulation: a token entering a queue should not be younger than this boundary. A queue is only able to delay tokens (registers), and therefore can only work with tokens that are older than the queue age.

If such a consistency violation is detected, a warning message is issued and the token age is adapted to that of the queue. Otherwise, the time boundary of the queue is updated with the token age after the token is installed on the queue.

The queue age is steered by the actor that drives it. For each actor the designer formulates an iteration time. The iteration time corresponds the cycle budget that the designer expects to need for the detailed actor description. Upon each actor firing, the queues driven by the actor are aged with the iteration time.

At the same time, the actor operations also increase the age of the tokens they process. For normal operations, the resulting token age is equal to the maximum of the operand token ages. For registered signals (only present in SFG-level actor descriptions), the token age is increased by one. Besides aging by operation, aging inside of the queues is also possible by attaching a travel delay to each queue.

Like the high-level actor description, a queue is also annotated with a number of expectations. These annotations reflect what the implementation of the queue as a set of communication busses should look like.

A communication bus contains one or more registers to provide intermediate storage, and optionally also a handshake-protocol circuit. A queue then maps to one or more (for parallel communication) of these communication busses.

The expectations for a simulation queue are:
   The token concurrency, that expresses how many tokens of the same age can be present on one queue. To communicate a MATLAB vector annotated with 8@2 for example requires two communication busses. This is reflected in the high level queue model by setting the token concurrency to two.
   In case the token concurrency is 1, it can be required that subsequent tokens are separated by a determined number of clock cycles. In combination with the travel delay, this determines how many registers are needed on a communication bus. This expectation is called the token latency.

Figure 9:
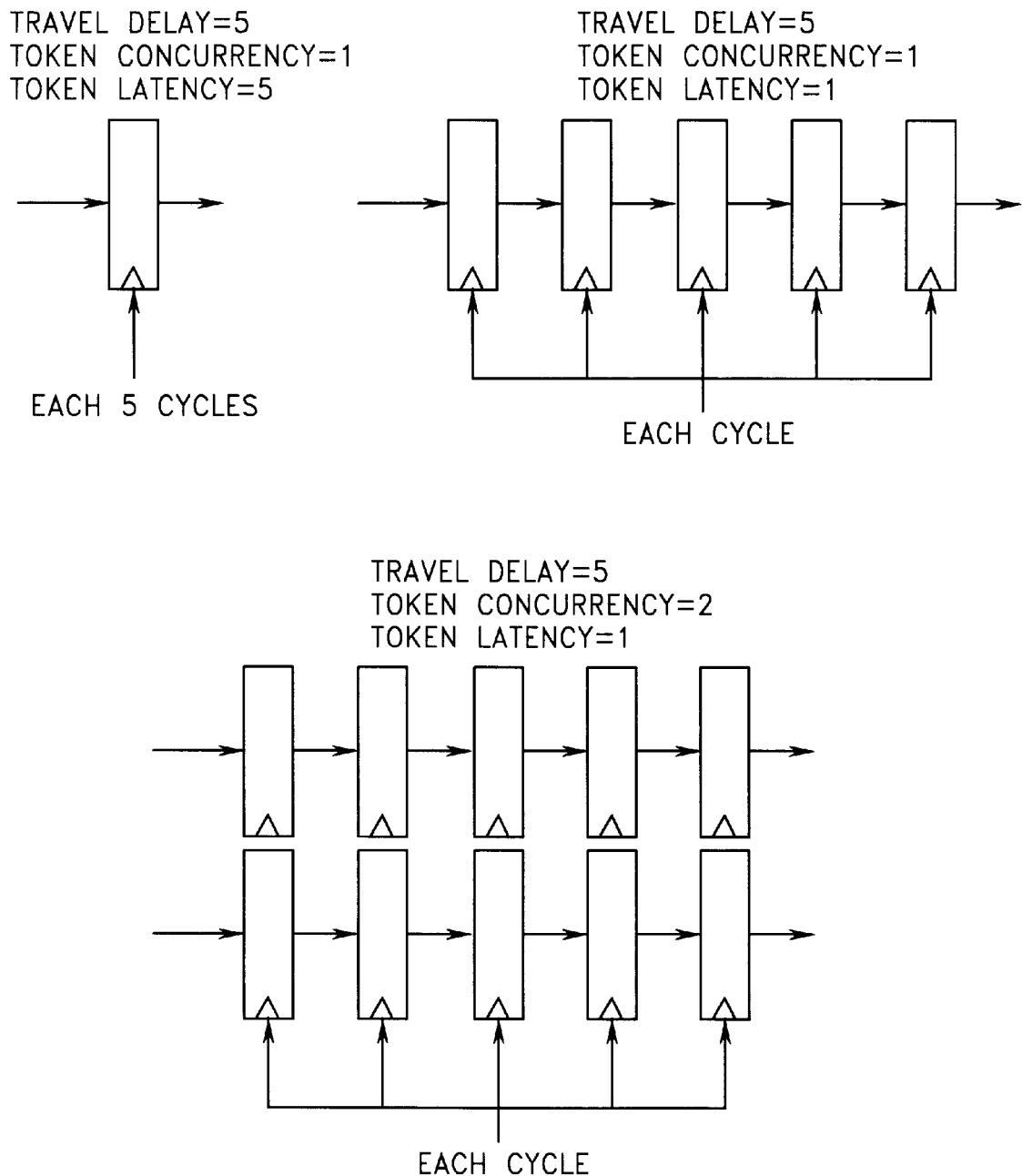
In FIG. 9, example implementations for different expectations are given.

Example implementations for different expectations are shown in FIG. 9.

When the token concurrency is different from one, the token latency cannot be bigger than one. If it would, then the actor that provides the tokens can be designed more effectively using hardware sharing, and thus reducing the token concurrency. A summary of the expectation based simulation is put as follows. First, there are several implicit adaptations to token ages and queue ages.

An actor description increases the queue age upon each actor iteration with the iteration time.

A queue increases the age of communicated tokens with the travel delay.

An SFG description increases token ages through the operations. The token age after a register is increased by one, all other operations generate a token with age equal to the maximum of the operand ages.

The set of operations that modify the token age are referred to as token aging rules.

Next, a number of checks are active to verify the consistency of the simulation.

A token age cannot be younger (smaller) then a queue age.

The token concurrency on a queue cannot be exceeded.

The token latency on a queue cannot be exceeded.

A successful clock-cycle true simulation should never fail any of these checks. In the case of such success, the expectations on the queue can be investigated more closely to devise a communication bus for it. In this description we did not mention the use of handshake protocol circuits. A handshake protocol circuit can be used to synchronize tokens of different age at the input of an actor.

Implementation

The current library of OCAPI allows to describe a system in C++ by building on a set of basic classes.

A simulation queue class that transports a token class and allows to perform expectation-checks.

An SFG/FSM class that allows clock cycle true specification, simulation and code generation.

A token class that allows to simulate both floating point-type representation and fixed point type representation.

One can simulate the MATLAB data-vector data-type with C++ simulation queues. For the common MATLAB operations, one can develop a library of SFG descriptions that reflect different flavors of parallelism. For instance, a C++ version of the description % input data
  in=[1 2 1 3 3 4 1 2];
% spreading code
  c=[1 −1 1 −1];
% correlate
  ot=corr (in, c)
% find correlation peak
  [max, maxpos]=max (ot);

looks, after scaling of the parallelism and defining the actor boundaries, like

FB in, ot, maxp;
in.delay(1,0); //iteration time, travel delay
ot.delay(1,0);
maxp.delay(4,0);
in.expect(1,1); //travel time, concurrency, latency
ot.expect(1,1);
maxp.expect(1,4);
in vector(1, 2, 1, 3, 3, 4, 1, 2);
ot=corr(8, 4, in, vector(1, −1, 1, −1))
maxp=maxpos(4, ot);

This C++ description contains all information necessary to simulate the system in mind at clock cycle true level and to generate the synthesizable code for the system and the individual actors.

Thus, the data-flow level has become transparent—it is not explicitly seen by the designer but rather it is implied through the expectations (pragma's) and the library.

EXAMPLE 2

An example of processor design is given next to experience hardware design when using OCAPI. The task is to design a 4-tap correlator processor that evaluates a correlation value each two cycles. One coefficient of the correlation pattern needs to be programmable and needs to be read in after a control signal is asserted. The listing in FIG. 11 gives the complete FSMD model of this processor.

The top of the listing shows how types are declared in OCAPI. For example, the type T_sample is 8 bits wide and has 6 bits beyond the binary point.

For such a type declaration, a signed, wrap-around and truncating representation is assumed by default. This can be easily changed, as for instance in //floating point
  dfix T_sample;
//unsigned
  dfix T_sample(8, 6, ns);
//unsigned, rounding
  dfix T_sample(8, 6, ns, rd);

Below the type declarations we see coefficient declarations. These are specified as plain double types, since they will be automatically quantized when read in into the coefficient registers. It is possible to intermix existing C/C++ constructs and types with new ones.

Following the coefficients, the FSMD definition of the correlator processor is shown. This definition requires: the specification of the instruction set that is processed by this processor, and a specification of the control behavior of the processor. For each of these, OCAPI uses dedicated objects.

First, the instruction set is defined. Each instruction performs data processing on signals, which must be defined first. The definitions include plain signals (sample_in and corr_out), registers (accu), and register arrays (coef[] and sample[]).

Next, each of the instructions are defined. A definition is started by creating a SFG object. All signal expressions that come after such an SFG definition are considered to make up part of it. A SFG definition is closed simply by defining a new SFG object.

The first instruction, initialize_coefs, initializes the coefficient registers coef[]. The for loop allows to express the initialization in a compact way. Thus, the initialize_coefs instruction is also equivalent to coef[0]=W(T_coef, hardwired_coef[0]);
  coef[1]=W(T_coef, hardwired_coef[1]);
  coef[2]=W(T_coef, hardwired_coef[2]);
  coef[3]=W(T_coef, hardwired_coef[3]);

The second instruction programs the value of the first coefficient. The new value, coef_in, is read from an input port of the FSMD with the same name. Beyond this port, we are 'outside' of the timed FSMD description and use data-flow semantics, and communicate via queues. The third and fourth instruction, correl_1 and correl_2 describe the two phases of the correlation. It is very easy to express complex expressions just by using C++ operators. Also, a cast operation is included that limits the precision of the intermediate expression result. Although this is for minor importance for simulation, it has strong influence on the hardware synthesis result.

The instruction read_sample shifts the data delay line. In addition to a for loop, an if expression is used to express the boundary value for the delay line. Use of simple C++ constructs such as these allow to express signal flow graph structure in a compact an elegant way. It is especially useful in parametric design.

The last instruction, read_control, reads in the control value that will decide whether the first correlation coefficient needs to be refreshed.

Below all SFG definitions, the control behavior of the correlator processor is described. An FSM with tree states is defined, using one initial state rst, and two normal states phase_1 and phase_2. Next, four transitions are defined between those three states. Each transition specifies a start state, the transition condition, a set of instructions to execute, and a target state. For a designer used to finite state machine specification, this is a very compact and efficient notation. The transition condition always is always true, while a transition condition like cnd(load) will be true whenever the register load contains a one.

The resulting fsm description is returned to OCAPI by the last return statement. The simulator and code generator can now process the object hierarchy in order to perform semantical checks, simulation, and code generation.

Figure 12:
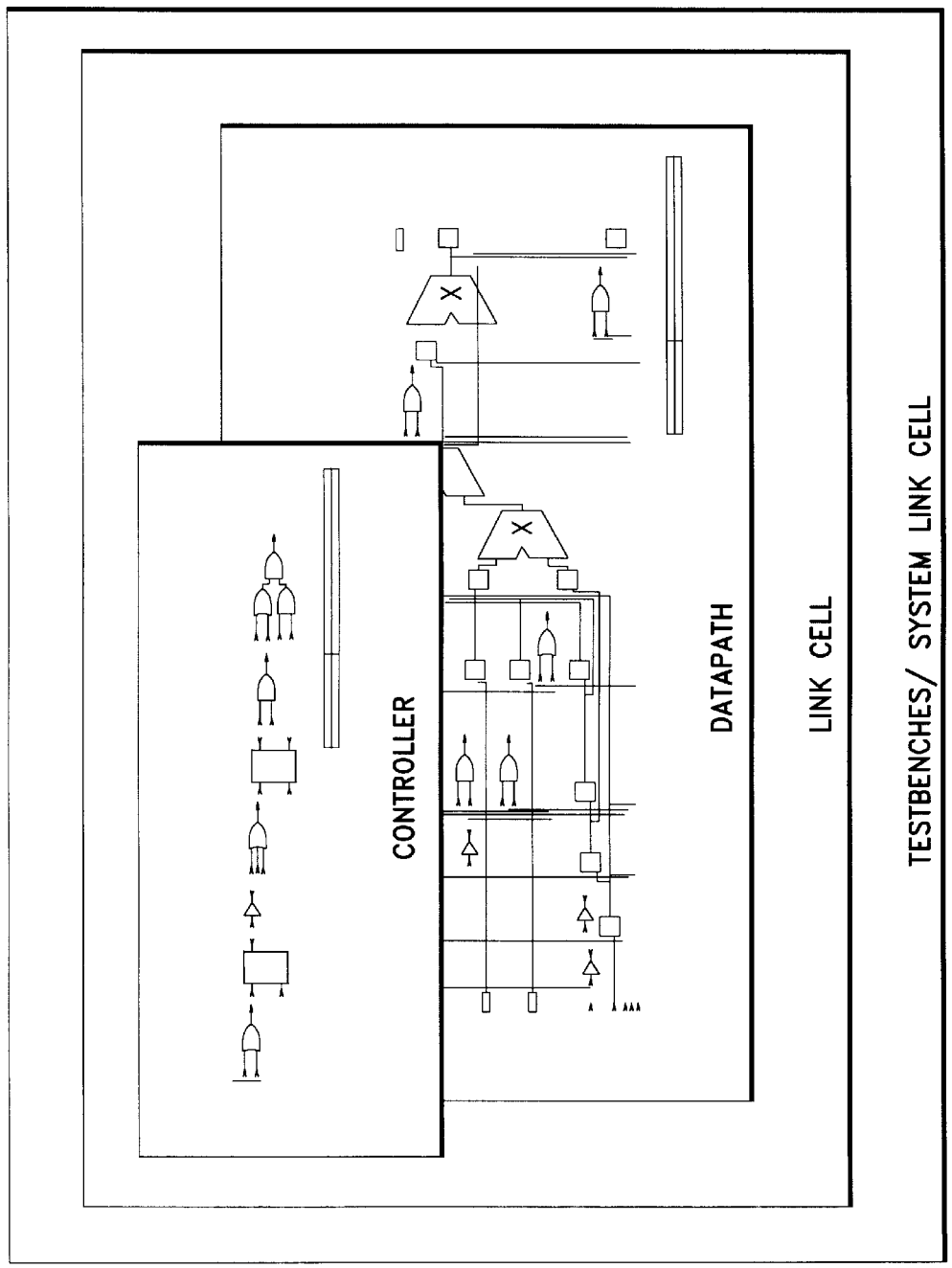
In FIG. 12, the resulting circuit for datapath and controller is hierarchically drawn.

The translation to synthesizable VHDL and Cathedral-3 code is automatic and needs no extra designer effort. The resulting circuit for datapath and controller is shown in FIG. 12. The hierarchy of the generated code that is provided by OCAPI is also indicated. Each controller and datapath are interlinked using a link cell. The link cell itself can be embedded into an automatically generated testbench or also in the system link cell that interconnects all components.

EXAMPLE 3

Design of Complex High Speed ASICs

Figure 13:
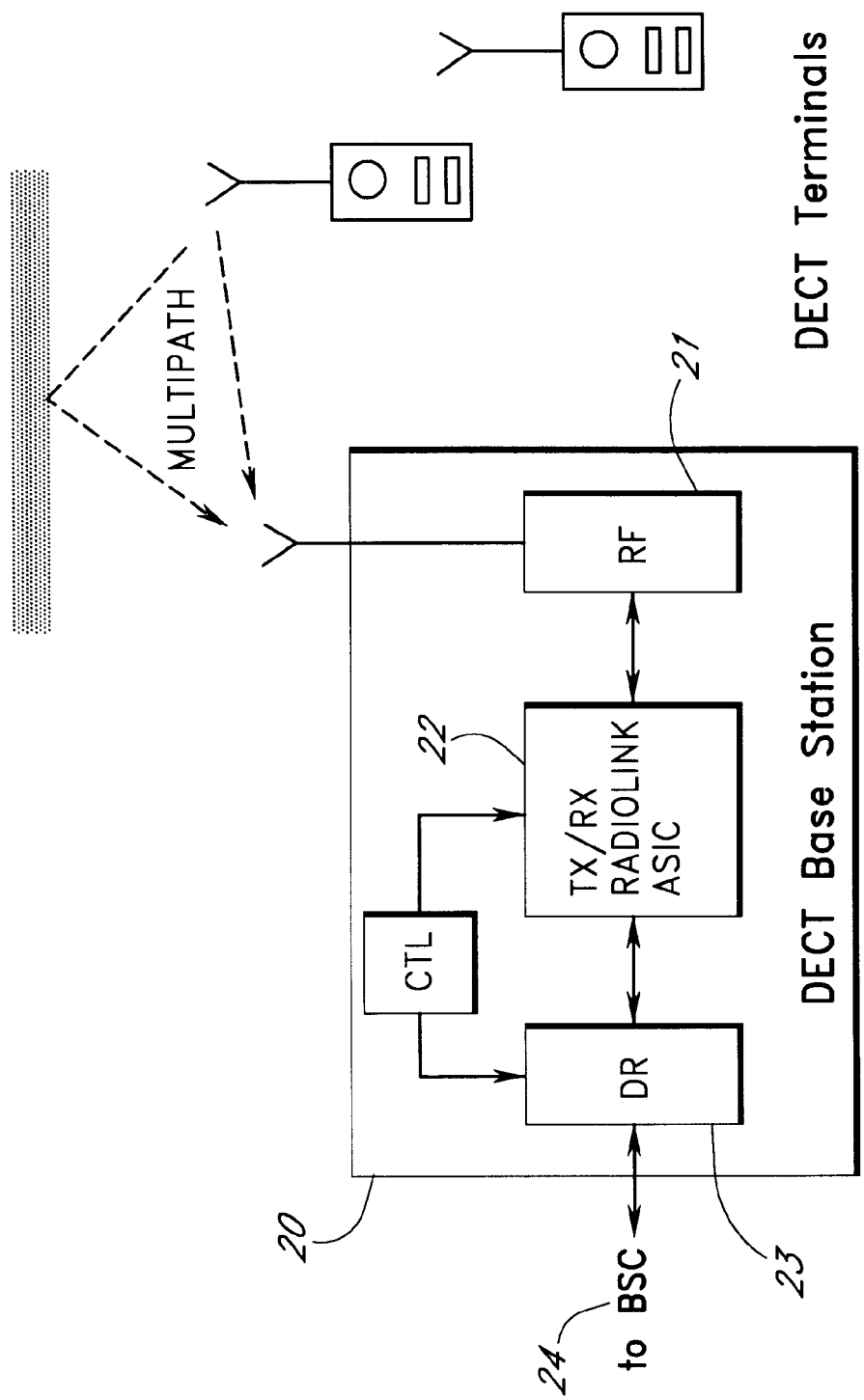
FIG. 13 describes a DECT Base station setup.

The design of a 75 Kgate DECT transceiver is used as an example. The design consists of a digital radiolink transceiver ASIC, residing in a DECT base station (20)(FIG. 13). The chip processes DECT burst signals, received through a radio frequency front-end RF (21). The signals are equalized to remove the multipath distortions introduced in the radio link (22). Next, they are passed to a wire-link driver DR (23), that establishes communication with the base station controller BSC (24). The system is also controlled locally by means of a control component CTL (25).

The specifications that come with the design of the digital transceiver ASIC in this system are as follows:
- The equalization involves complex signal processing, and is described and verified inside a high level design environment such as MATLAB.
- The interfacing towards the control component CTL and the wire-link driver DR on the other hand is described as a detailed clock-cycle true protocol.
- The allowed processing latency is, due to the real time operation requirements, very low: a delay of only 29 DECT symbols (25.2 $\mu$seconds) is allowed. The complexity of the equalization algorithm, on the other hand, requires up to 152 data multiplies per DECT symbol to be performed. This implies the use of parallel data processing, and introduces a severe control problem.
- The scheduled design time to arrive from the heterogeneous set of specifications to the verified gate level netlist, is 18 person-weeks.

The most important degree of freedom in this design process is the target architecture, which must be chosen such that the requirements are met. Due to the critical design time, a maximum of control over the design process is required. To achieve this, a programming approach to implementation is used, in which the system is modelled in C++. The object oriented features of this language allows to mix high-level descriptions of undesigned components with detailed clock-cycle true, bit-true descriptions. In addition, appropriate object modelling allows the detailed descriptions to be translated to synthesizable HDL automatically. Finally, verification testbenches can be generated automatically in correspondence with the C++ simulation.

The result of this design effort is a 75 Kgate chip with a VLIW architecture, including 22 datapaths, each decoding between 2 and 57 instructions, and including 7 RAM cells. The chip has a 194 die area in 0.7 CMOS technology.

The C++ programming environment allows to obtain results faster then existing approaches. Related to register transfer design environments such as, it will be shown that C++ allows to obtain more compact, and consequently less error prone descriptions of hardware. High level synthesis environments could solve this problem but have to fix the target architecture on beforehand. As will be described in the case of the DECT transceiver design, sudden changes in target architecture can occur due to hard initial requirements, that can be verified only at system implementation.

First, the system machine model is introduced This model includes two types of description: high-level untimed ones and detailed timed blocks. Using such a model, a simulation mechanism is constructed. It will be shown that the proposed approach outperforms current synthesis environments in code size and simulation speed. Following this, HDL code generation issues and hardware synthesis strategies are described.

System Machine Model

Due to the high data processing parallelism, the DECT transceiver is best described with a set of concurrent processes. Each process translates to one component in the final system implementation.

At the system level, processes execute using data flow simulation semantics. That is, a process is described as an iterative behavior, where inputs are read in at the start of an iteration, and outputs are produced at the end. Process execution can start as soon as the required input values are available.

Inside of each process, two types of description are possible. The first one is a high level description, and can be expressed using procedural C++ constructs. A firing rule is also added to allow dataflow simulation.

The second flavour of processes is described at register transfer level. These processes operate synchronously to the system clock. One iteration of such a process corresponds to one clock cycle of processing.

For system simulation, two schedulers are available. A dataflow scheduler is used to simulate a system that contains only untimed blocks. This scheduler repeatedly checks process firing rules, selecting processes for execution as their inputs are available.

When the system also contains timed blocks, a cycle scheduler is used instead. The cycle scheduler manages to interleave execution of multi-cycle descriptions, but can incorporate untimed blocks as well.

Figure 14:
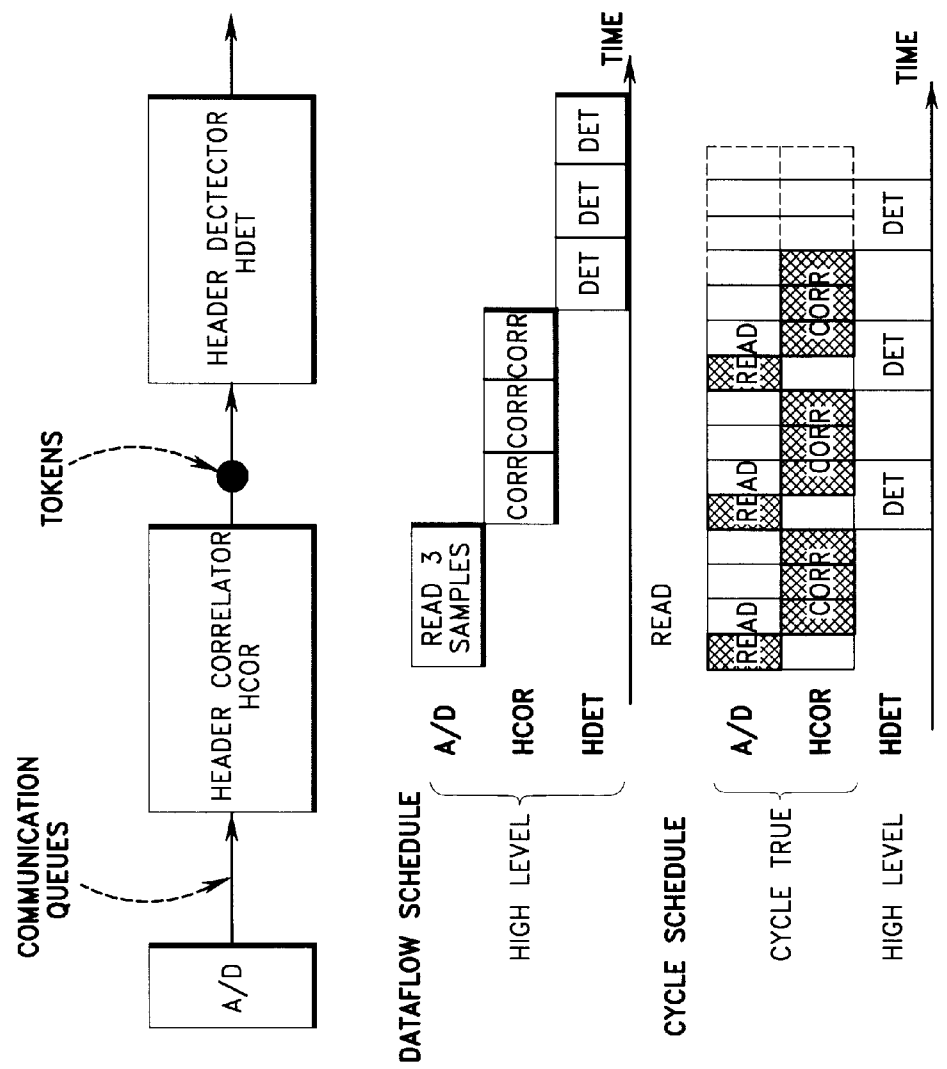
FIG. 14 shows the front-end processing of the DECT transceiver.

FIG. 14 shows the front-end processing of the DECT transceiver, and the difference between data-flow and cycle scheduling. At the top, the front-end processing is seen. The received signals are sampled by and A/D, and correlated with a unique header pattern in the header correlator HCOR. The resulting correlations are detected inside a header detector block HDET. A simulation with high level descriptions uses the dataflow scheduler. An example dataflow schedule is seen in the middle of the figure. The A/D high level description produces 3 tokens, which are put onto the interconnect communication queue. Next, the correlator high level description can be fired three times, followed by the detector processing.

When a cycle true description of the A/D and header correlator on the other hand is available, this system can be simulated with the cycle scheduler as shown on the bottom of the figure. This time, behavior of the A/D block and correlator block are interleaved. As shown for the HCOR block, executions can take multiple cycles to perform. The remaining high level block, the detector, contains a firing rule and is executed as required. Related to the global clock grid, it appears as a combinatorial function.

Detailed process descriptions reflect the hardware behavior of a component at the same level of the implementation. To gain simulation performance and coding effort, several abstractions are made.

Finite Wordlength effects are simulated with a C++ fixed point library. It has been shown that the simulation of these effects is easy in C++. Also, the simulation of the quantization rather than the bitvector representation allows significant simulation speedups.

The behavior is modelled with a mixed control/data processing description, under the form of a finite state machine coupled to a datapath. This model is common in the synthesis community. In high throughput telecommunications circuits such as the ones in the DECT transceiver ASIC, it most often occurs that the desired component architecture is known before the hardware description is made. The FSMD model works well for these type of components.

The two aspects, wordlength modelling and cycle true modelling, are available in the programming environment as separate class hierarchies. Therefore, fixed point modelling can be applied equally well to high level descriptions.

Figure 15:
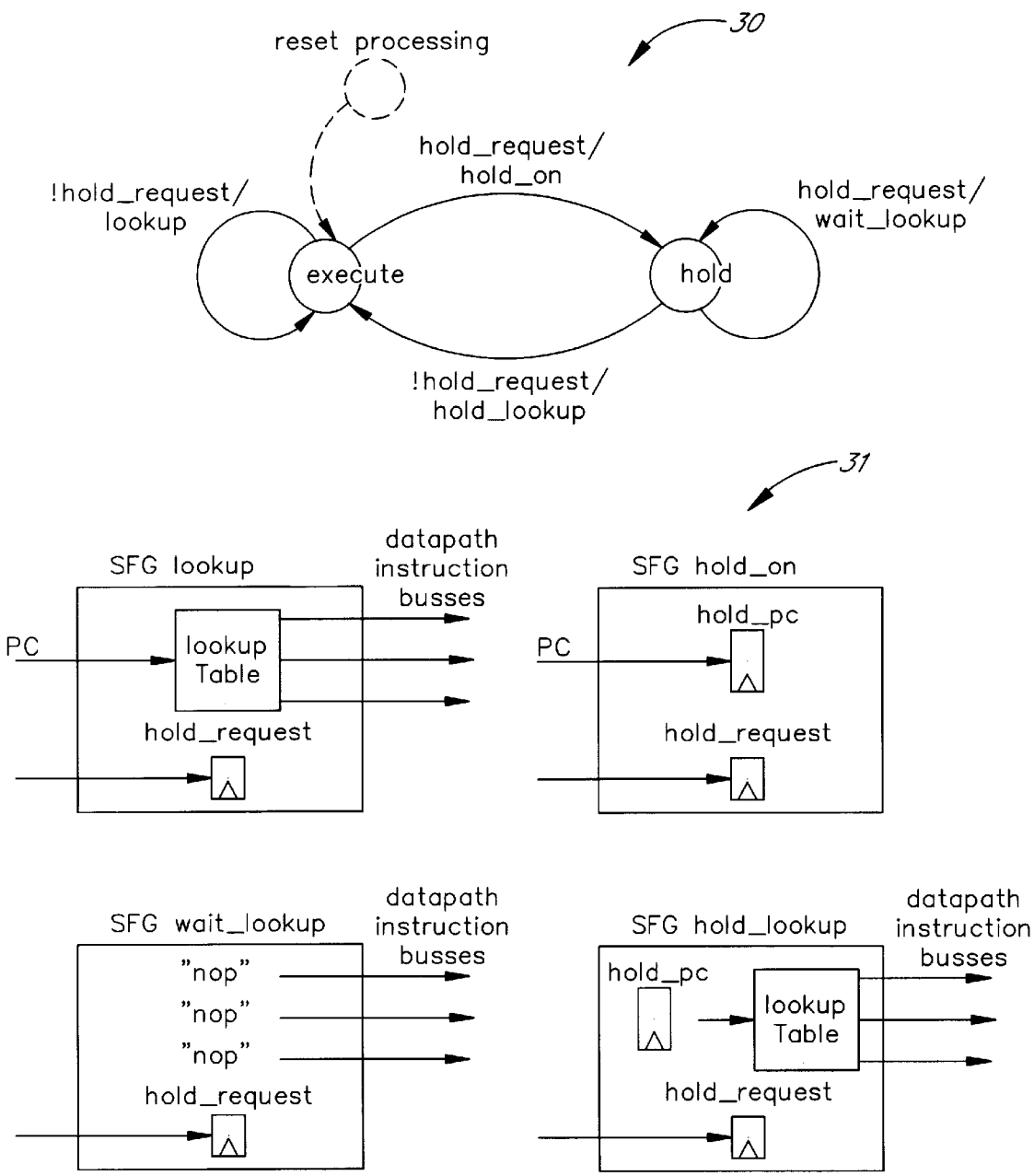
In FIG. 15, a part of the central VLIW controller description for the DECT transceiver ASIC is shown.

As an illustration of cycle true modelling, a part of the central VLIW controller description for the DECT transceiver ASIC is shown in FIG. 15. The top shows a Mealy type finite state machine (30). As actions, the signal flowgraph descriptions (31) below it are executed. The two states execute and hold correspond to operational and idle states of the DECT system respectively. The conditions are stored in registers inside the signal flowgraphs. In this case, the condition holdrequest is related to an external pin.

In execute state, instructions are distributed to the datapaths. Instructions are retrieved out of a lookup table, addressed by a program counter. When holdrequest is asserted, the current instruction is delayed for execution, and the program counter PC is stored in an internal register. During a hold, a nop instruction is distributed to the datapaths to freeze the datapath state. As soon as holdrequest is removed, the stored program counter holdpc addresses the lookup table, and the interrupted instruction is issued to the datapaths for execution.

Signals and Signal Flow Graphs

Signals are the information carriers used in construction of a timed description. Signals are simulated using C++ sig objects. These are either plain signals or else registered signals. In the latter case the signals have a current value and next value, which is accessed at signal reference and assignment respectively. Registered signals are related to a clock object clk that controls signal update. Both types of signals can be either floating point values or else simulated fixed point values.

Using operations, signals are assembled to expressions. By using the overloading mechanism as shown in FIG. 16, the parser of the C++ compiler is reused to construct the signal flowgraph data structure.

An example of this is shown in FIG. 17. The top of the figure shows a C++ fragment (40). Executing this yields the data structure (41) shown below it. It is seen that the signal flowgraph consists both of user defined nodes and operation nodes. Operation nodes keep track of their operands through pointers. The user defined signals are atomic and have null operand pointers.

The assignment operations use reversed pointers allowing to find the start of the expression tree that defines a signal.

A set of sig expressions can be assembled in a signal flow graph (SFG). In addition, the desired inputs and outputs of the signal flowgraph have to be indicated. This allows to do semantical checks such as dangling input and dead code detection, which warn the user of code inconsistency.

An SFG has well defined simulation semantics and represents one clock cycle of behavior.

Finite State Machines

After all instructions are described as SFG objects, the control behavior of the component has to be described. We use a Mealy-type FSM model to do this.

Again, the use of C++ objects allow to obtain very compact and efficient descriptions. FIG. 18 shows a graphical and C++-textual description of the same FSM. The correspondence is obvious. To describe an equivalent FSM in an event driven HDL, one usually has to follow the HDL simulator semantics, and for example use multi-process modelling. By using C++ on the other hand, the semantics can be adapted depending on the type of object processed, all within the same piece of source code.

Architectural Freedom

Figure 19:
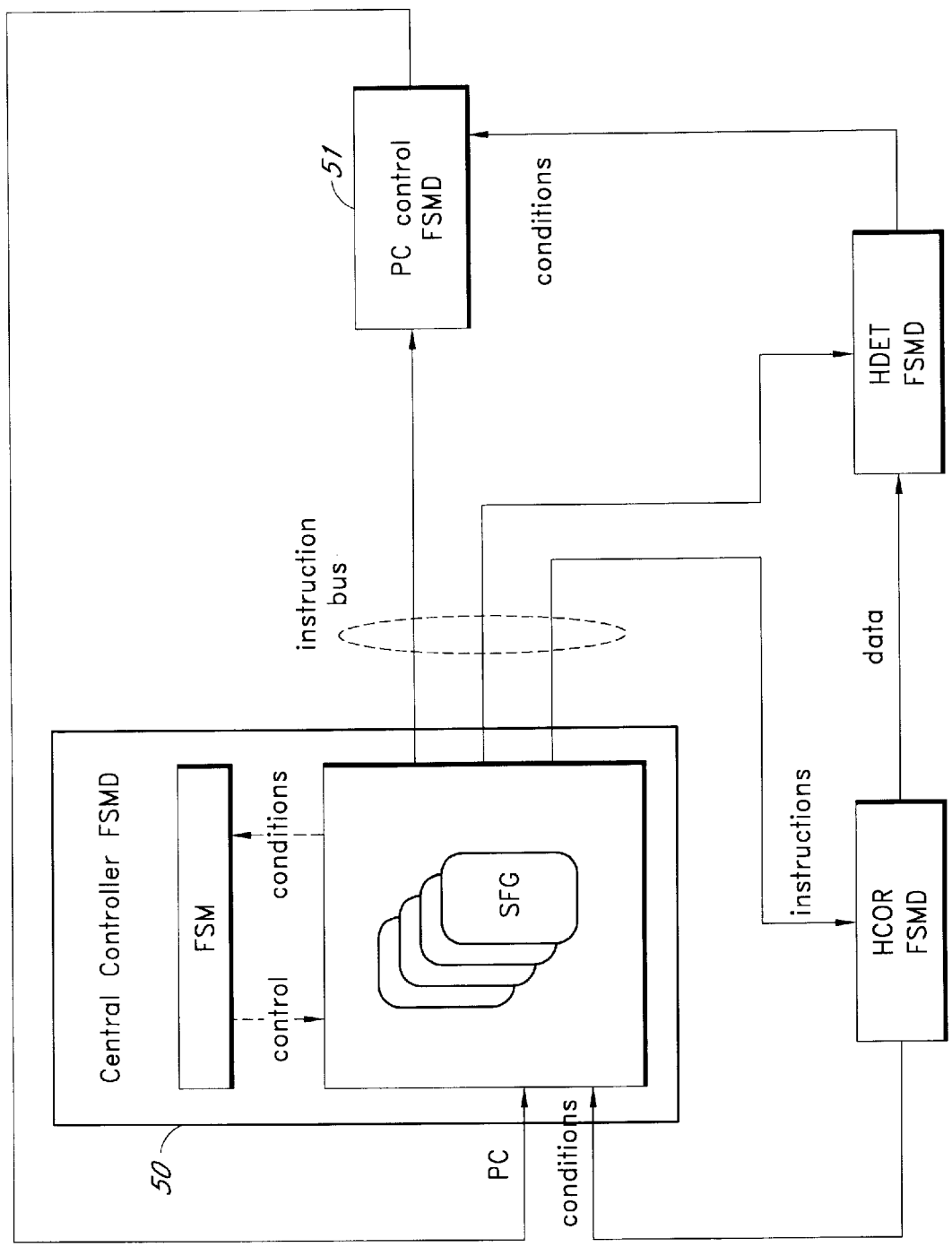
In FIG. 19, the final system architecture of the DECT transceiver is shown.

An important property of the combined control/data model is the architectural freedom it offers. As an example, the final system architecture of the DECT transceiver is shown in FIG. 19. It consists of a central (VLIW) controller (50), a program counter controller (51) and 22 datapath blocks. Each of these are modelled with the combined control/data processing shown above. They exchange data signals that, depending on the particular block, are interpreted as instructions, conditions or signal values. By means of these interconnected FSMD machines, a more complex machine is constructed.

Figure 20:
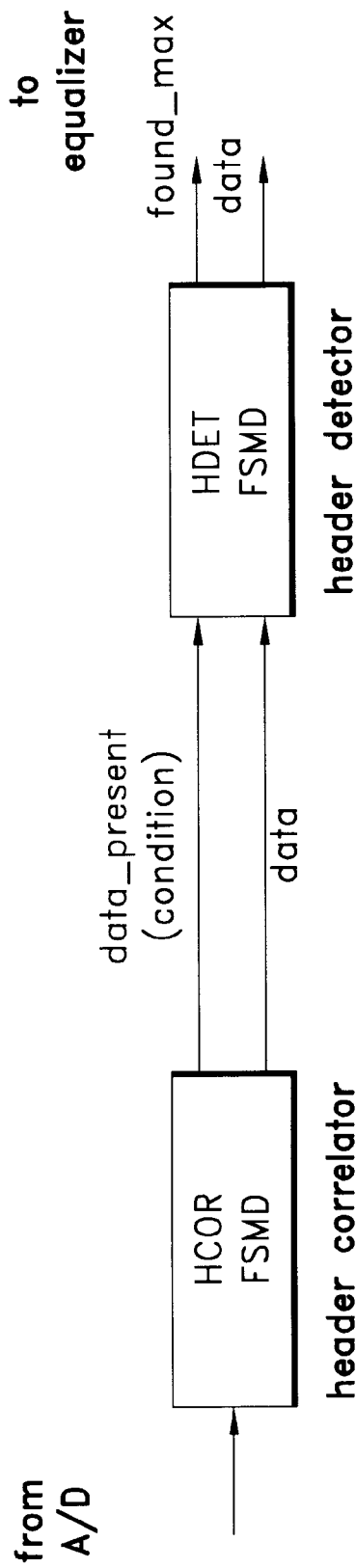
In FIG. 20, a dataflow target architecture is shown.

It is now motivated why this architectural freedom is necessary. For the DECT transceiver, there is a severe latency requirement. Originally, a dataflow target architecture was chosen (FIG. 20), which is common for this type of telecommunications signal processing. In such an architecture, the individual components are controlled locally and data driven. For example, the header detector processor signals a DECT header start (a correlation maximum), as soon as it is sure that a global maximum is reached.

Because of the latency requirement however, extra delay in this component cannot be allowed, and it must signal the first available correlation maximum as a valid DECT header. In case a new and better maximum arrives, the header detector block must then raise an exception to subsequent blocks to indicate that processing should be restarted. Such an exception has global impact. In a data driven architecture however, such global exceptions are very difficult to implement. This is far more easy in a central control architecture, where it will take the form of a jump in the instruction ROM. Because of these difficulties, the target architecture was changed from data driven to central control. The FSMD machine model allowed to reuse the datapath descriptions and only required the control descriptions to be reworked. This architectural change was done during the 18-week design cycle.

The Cycle Scheduler

Whenever a timed description is to be simulated, a cycle scheduler is used instead of a dataflow scheduler. The cycle scheduler creates the illusion of concurrency between components on a clock cycle basis.

Figure 21:
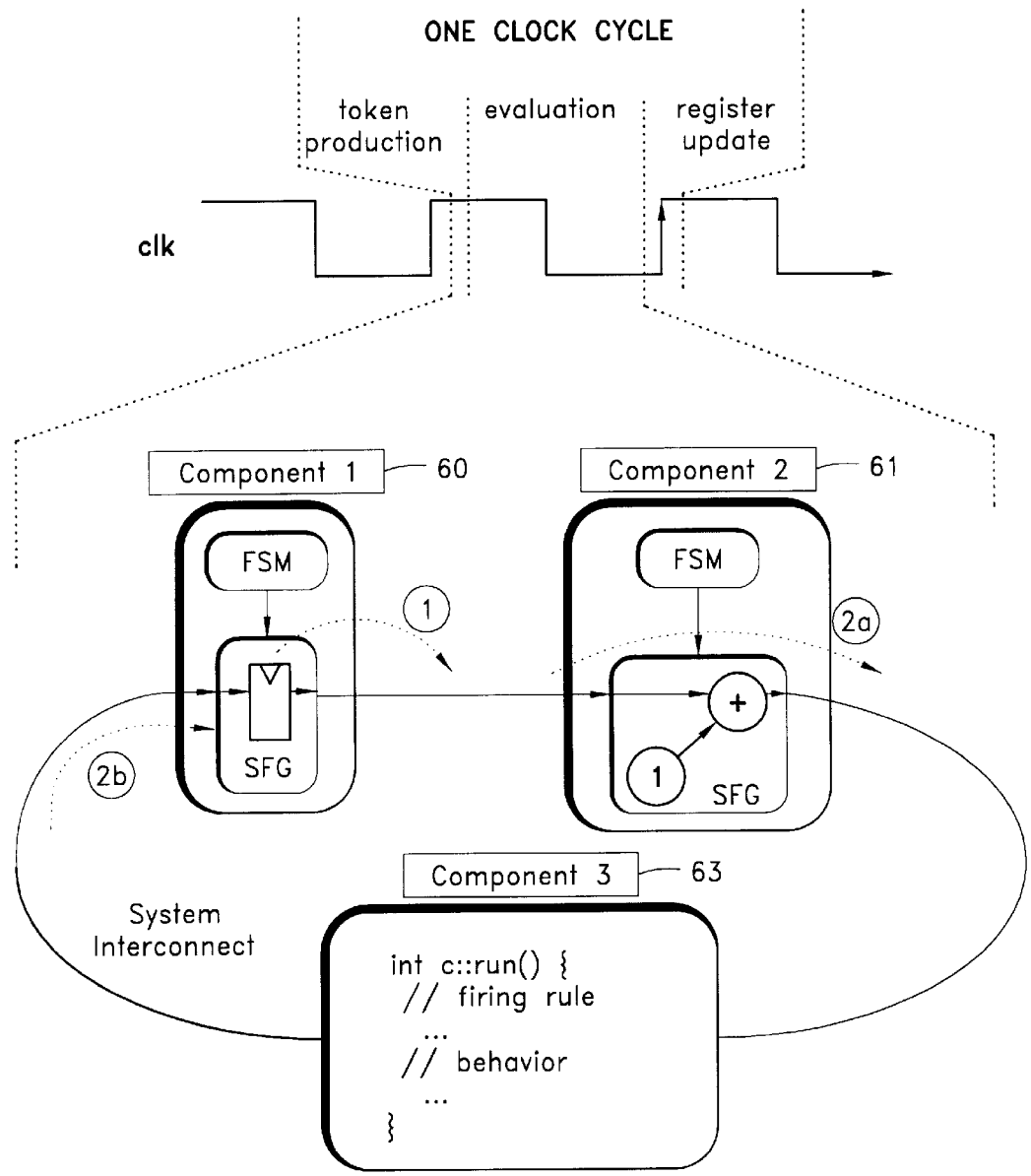
In FIG. 21, the simulation of one cycle in a system with three components is shown.

The operation of the cycle scheduler is best illustrated with an example. In FIG. 21, the simulation of one cycle in a system with three components is shown. The first two, components 1 (60) and 2 (61), are timed descriptions constructed using fsm and sfg objects. Component 3 (62) on the other hand is decribed at high level using a firing rule and a behavior. In the DECT transceiver, such a loop of detailed (timed) and high level (untimed) components occurs for instance in the RAM cells that are attached to the datapaths. In that case, the RAM cells are described at high level while the datapaths are described at clock cycle true level.

The simulation of one clock cycle is done in three phases. Traditional RT simulation uses only two; the first being an evaluation phase, and the second being a register update phase.

The three phases used by the cycle scheduler are a token production phase, an evaluation phase and a register update phase. The three-phase simulation mechanism is needed to avoid apparent deadlocks that might exist at the system level. Indeed, in the example there is a circular dependency in between components 1, 2, and 3, and a dataflow scheduler can no longer select which of the three components should be executed first. In dataflow simulation, this is solved by introducing initial tokens on the data dependencies. Doing so would however require us to devise a buffer implementation for the system interconnect, and introduce an extra code generator in the system.

The cycle scheduler avoids this by creating the required initial tokens in the token production phase. Each of the phases operates as follows.

[0] Each the start of clock cycle, the sfg descriptions to be executed in the current clock cycle are selected. In each fsm description, a transition is selected, and the sfg related to this transition are marked for execution.

[1] Token production phase. For each marked sfg, look into the dependency graph, and identify the outputs that solely depend on registered signals and/or constant signals. Evaluate these outputs and put the obtained tokens onto the system interconnect.

[2] (a) Evaluation phase (case a). In the second phase, schedule marked sfg and untimed blocks for execution until all marked sfg have fired. Output tokens are produced if they are directly dependent on input tokens for timed sfg descriptions, or else if they are outputs of untimed blocks.

[2] (b) Evaluation phase (case b). Outputs that are however only dependent on registered signals or constants will not be produced in the evaluation phase.

[3] Register update phase. For all registered signals in marked sfg, copy the next-value to the current-value.

The evaluation phase of the three-phase simulation is an iterative process. If a pre-set amount of iterations have passed, and there are still unfired components, then the system is declared to be deadlocked. This way, the cycle scheduler identifies combinatorial loops in the system.

Code Generation and Simulation Strategy

The clock-cycle true, bit-true description of system components serves a dual purpose. First, the descriptions have to be simulated in order to validate them. Next, the descriptions have also to be translated to an equivalent, synthesizable HDL description.

In view of these requirements, the C++ description itself can be treated in two ways in the programming environment. In case of a compiled code approach, the C++ description is translated to directly executable code. In case of an interpreted approach, the C++ description is preprocessed by the design system and stored as a data structure in memory.

Both approaches have different advantages and uses. For simulation, execution speed is of primary importance. Therefore, compiled code simulation is needed. On the other hand, HDL code generation requires the C++ description to be available as a data structure that can be processed by a code generator. Therefore, a code generator requires an interpreted approach.

Figure 22:
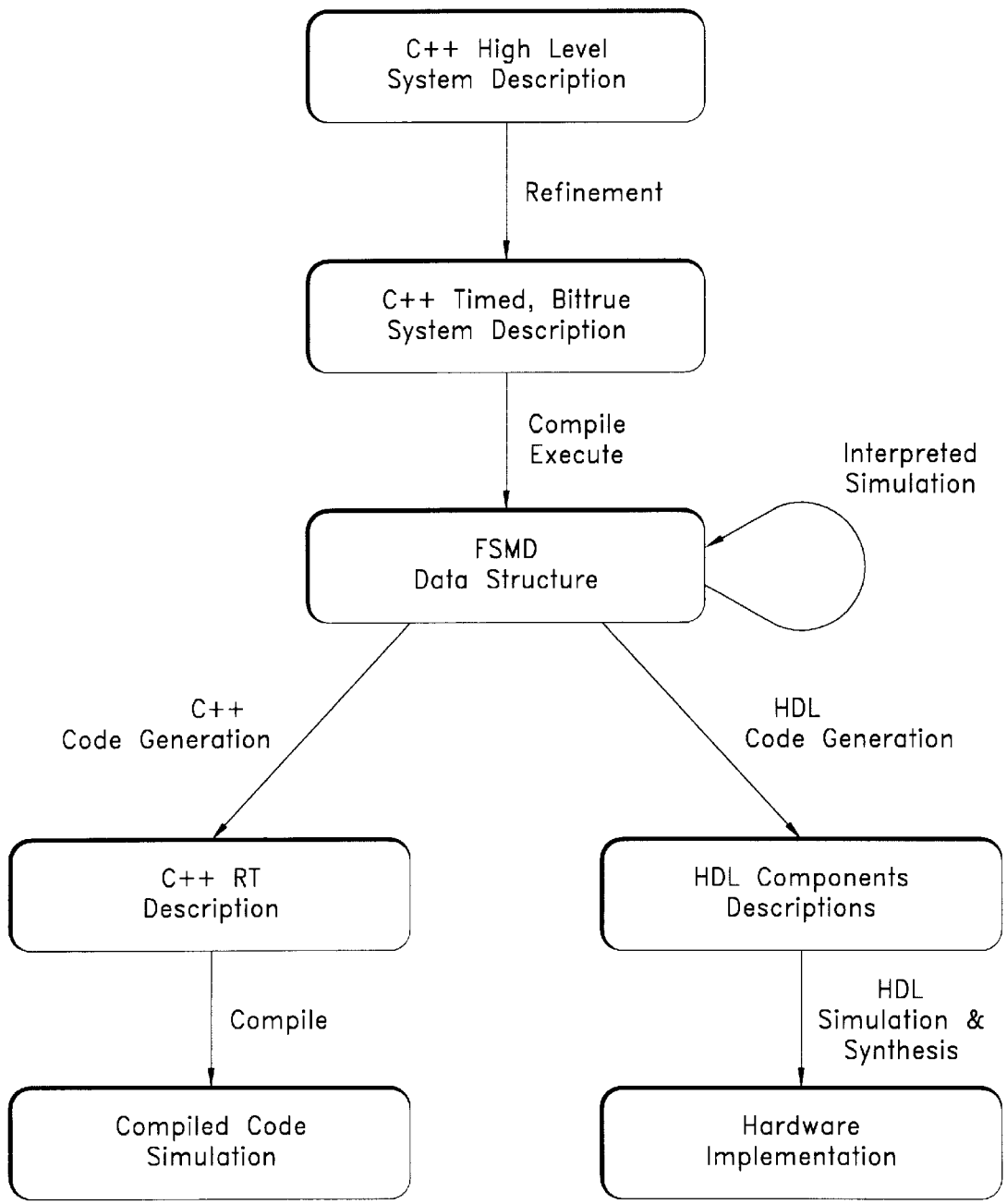
In FIG. 22, the implementation and simulation strategy is depicted.

We solve this dual goal by using a strategy as shown in FIG. 22. The clock-cycle true and bit-true description of the system is compiled and executed. The description uses C++ objects such as signals and finite state machine descriptions which translate themselves to a control/data flow data structure.

This data structure can next be interpreted by a simulator for quick verification purposes. The same data structure is also processed by a code generator to yield two different descriptions.

A C++ description can be regenerated to yield an application-specific and optimized compiled code simulator. This simulator is used for extensive verification of the design because of the efficient simulation runtimes.

A synthesizable HDL description can also be generated to arrive at a gate-level implementation.

The simulation performance difference between these three formats (interpreted C++ objects, compiled C++, and HDL) is illustrated in table 1. Simulation results are shown for the DECT header correlator processor, and also the complete DECT transceiver ASIC.

The C++ modelling gains a factor of 5 in code size (for the interpreted-object approach) over RT-VHDL modeling. This is an important advantage given the short design cycle for the system. Compiled code C++ on the other hand provides faster simulation and smaller process size then RT-VHDL.

For reference, results of netlist-level VHDL and Verilog simulations are given.

TABLE 1

| Design | Size (Gates) | Type | Source Code (# lines) | Simulation Speed (cycles/s) | Process Size (Mb) |
|---|---|---|---|---|---|
| HCOR | 6K | C++(interpreted obj) | 230 | 69 | 3.8 |
| | | C++ (compiled) | 1700 | 819 | 2.7 |
| | | VHDL (RT) | 1600 | 251 | 11.9 |
| | | VHDL (Netlist) | 77000 | 2.7 | 81.5 |
| DECT | 75K | C++(interpreted obj) | 8000 | 2.9 | 20 |
| | | C++ (compiled) | 26000 | 60 | 5.1 |
| | | Verilog (Netlist) | 59000 | 18.3 | 100 |

Synthesis Strategy

Figure 23:
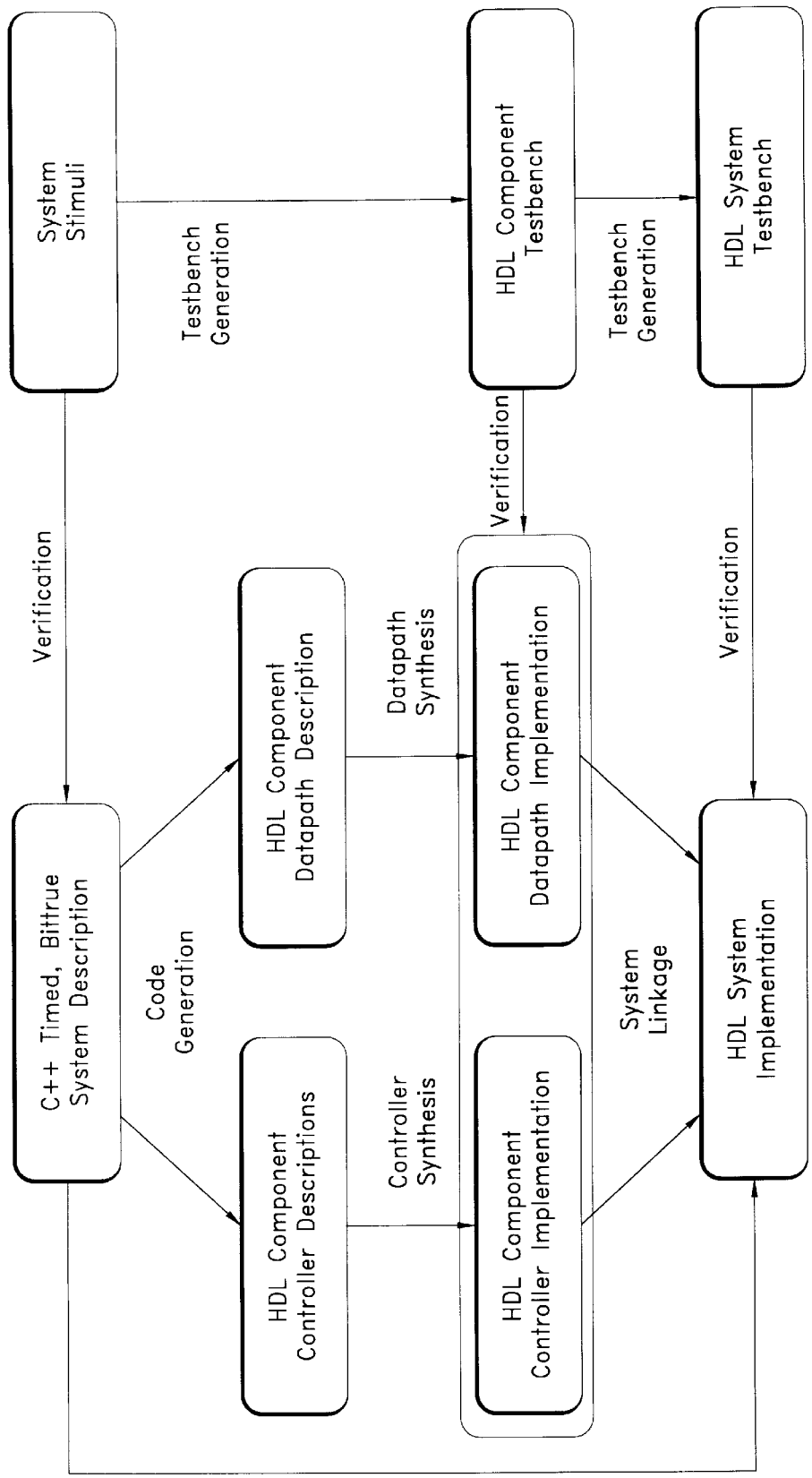
In FIG. 23, the translation flow from C++ to HDL is shown.

Finally, we document the synthesis approach that was used for the DECT transceiver. As shown in FIG. 23, the clock-cycle true, bit-true C++ description can be translated from within the programming environment into equivalent HDL.

For each component, a controller description and a datapath description is generated, in correspondence with the C++ description. This is done because we rely on separate synthesis tools for both parts, each one optimized towards controller or else datapath synthesis tasks.

For datapath synthesis, we rely on the Cathedral-3 back-end datapath synthesis tools, that allow to obtain a bitparallel hardware implementation starting from a set of signal flow-graphs. These tools allow operator sharing at word level, and result in run times less than 15 minutes even for the most complex, 57-instruction data path of the DECT transceiver.

Controller synthesis on the other hand is done by logic synthesis such as Synopsys DC. For pure logic synthesis such as FSM synthesis, this tool produces efficient results. The combined netlists of datapath and controller are also post-optimized by Synopsys DC to perform gate-level netlist optimizations. This divide and conquer strategy towards synthesis allows each tool to be applied at the right place.

During system simulation, the system stimuli are also translated into testbenches that allow to verify the synthesis result of each component. After interconnecting all synthesized components into the system netlist, the final implementation can also be verified using a generated system testbench.

Attached hereto as an Appendix entitled, "OCAPI/RT User Manual, Version 0.6" which includes further data, information and description related to the invention described herein. The owner of this User Manual retains any and all copyright rights this work. Therefore, except as provided for in 37 C.F.R. § 1.71(e), any copying, distributing, reproducing, or any other act or right protected by the copyright laws of the United States is strictly prohibited.

The invention may be embodied in other specific forms without departing from its spirit or essential characteristics. The described embodiments are to be considered in all respects only as illustrative and not restrictive. The scope of the invention is, therefore, indicated by the appended claims, rather than by the foregoing description. All changes which come within the meaning and range of equivalency of the claims are to be embraced within their scope.

What is claimed is:

1. A method of designing a system comprising at least one digital part, comprising refining, wherein a behavioral description of said system is transformed into an implementable description of said system, said behavioral description being represented as a first set of objects with a first set of relations therebetween and said implementable description being represented as a second set of objects with a second set of relations therebetween, and wherein said refining comprises translating behavioral characteristics at least partly into structural characteristics, and wherein said refining comprises first refining, wherein said behavioral description is a data-vector model and is at least partly transformed into a data-flow model.

2. The method of claim 1, further comprising simulating in which the behavior of said behavioral description, said implementable description and/or any intermediate description therebetween is simulated.

3. The method of claim 1, wherein said refining comprises the addition of new objects, permitting interaction with existing objects, and adjustments to said existing objects allowing said interaction.

4. The method of claim 1, wherein said refining is performed in an open environment and comprises expansion of existing objects.

5. The method of claim 1, wherein said refining further comprises second refining, wherein said data-flow model is at least partly transformed into an SFG model.

6. The method of claim 1, wherein said refining comprises first refining, said first refining comprising:
   determining the input vector lengths of input, output and intermediate signals;
   determining the amount of parallelism of operations that process input signals to output signals;
   determining actors, edges and tokens of said data-[]flow model; and
   determining the wordlength of said tokens.

7. The method of claim 1, wherein said second set of objects with said second set of relations therebetween are at least partly derived from said first set of objects with said first set of relations therebetween.

8. The method of claim 1, wherein objects belonging to said second set of objects are new objects, identical with and/or derived by inheritance from objects from said first set of objects, or a combination thereof.

9. The method of claim 5, further comprising combining several of said SFG models with a finite state machine description resulting in an implementable description.

10. The method of claim 9, further comprising transforming said implementable description to synthesizable code.

11. The method of claim 10, wherein said synthesizable code is VHDL code.

12. A method of simulating a system comprising at least one digital part, the method comprising transforming a description of a system having structural characteristics into compilable C++ code, wherein said description comprises the combination of several SFG data structures with a finite state machine description resulting in an implementable description, said implementable description being said compilable C++ code suitable for simulating said system as software and wherein behavioral characteristics are transformed at least partly into structural characteristics.

13. A method of simulating a system comprising at least one digital part, the method comprising transforming a description of a system having structural characteristics into compilable C++ code, wherein said simulating comprises a clock-cycle true simulation of said system being an expectation-based simulation using one or more SFG data structures, and wherein behavioral characteristics are transformed at least partly into structural characteristics said expectation-based simulation comprising:
   annotating a token age to every token;
   annotating a queue age to every queue;
   increasing token age according to the token aging rules and with the travel delay for every queue that has transported the token;
   increasing queue age with the iteration time of the actor steering the queue; and
   checking whether token age is never smaller than queue age throughout the simulation.

14. A hardware circuit or a software simulation of a hardware circuit designed with the method of claim 1.

15. A method of designing a system comprising at least one digital part, comprising refining wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises:

determining the input vector lengths of input, output and intermediate signals;

determining the amount of parallelism of operations that process input signals to output signals;

determining actors, edges and tokens of said data-flow model; and determining the wordlength of said tokens, wherein said second set of objects with said second set of relations therebetween are at least partly derived from said first set of objects with said first set of relations therebetween.

16. A method of designing a system comprising at least one digital part, comprising refining wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises:

determining the input vector lengths of input, output and intermediate signals;

determining the amount of parallelism of operations that process input signals to output signals;

determining actors, edges and tokens of said data-flow model; and determining the wordlength of said tokens, wherein objects belonging to said second set of objects are new objects, identical with and/or derived by inheritance from objects from said first set of objects, or a combination thereof.

17. A method of designing a system comprising at least one digital part, comprising refining wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises:

determining the input vector lengths of input, output and intermediate signals:

determining the amount of parallelism of operations that process input signals to output signals;

determining actors, edges and tokens of said data-flow model; and determining the wordlength of said tokens, wherein said determining the amount of parallelism comprises determining the amount of parallelism for every data vector and reducing the unspecified communication bandwidth of said data-vector model to a fixed number of communication buses in said dataflow model.

18. A method of designing a system comprising at least one digital part, comprising refining wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises:

determining the input vector lengths of input, output and intermediate signals;

determining the amount of parallelism of operations that process input signals to output signals;

determining actors, edges and tokens of said data-flow model; and determining the wordlength of said tokens, wherein said determination of actors, edges and tokens of said data-flow model comprises defining one or a group of data vectors in said first data-vector model as actors; defining data precedences crossing actor bounds, as edges, said edges behaving like queues and transporting tokens between actors; constructing a system schedule; and running a simulation on a computer environment.

19. A method of designing a system comprising at least one digital part, comprising:

refining, wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises first refining wherein said behavioral description is a data-vector model and is at least partly transformed into a data-flow model, wherein said refining further comprises second refining wherein said data-flow model is at least partly transformed into an SFG model, and wherein said second refining comprises transforming tokens from floating point to fixed point, wherein said second set of objects with said second set of relations therebetween are at least partly derived from said first set of objects with said first set of relations therebetween.

20. The method of claim 19, wherein objects belonging to said second set of objects are new objects, identical with and/or derived by inheritance from objects from said first set of objects, or a combination thereof.

21. A method of designing a system comprising at least one digital part, comprising:

refining, wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises first refining, wherein said behavioral description is a data-vector model and is at least partly transformed into a data-flow model, wherein said refining further comprises second refining, wherein said data-flow model is at least partly transformed into an SFG model, and wherein said SFG model is a timed fixed point SFG model.

22. The method of claim 21, wherein said second set of objects with said second set of relations therebetween are at least partly derived from said first set of objects with said first set of relations therebetween.

23. The method of claim 21, wherein objects belonging to said second set of objects are new objects, identical with and/or derived by inheritance from objects from said first set of objects, or a combination thereof.

24. A method of designing a system comprising at least one digital part, comprising:

refining, wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises first refining wherein said behavioral description is a data-vector model and is at least partly transformed into a data-flow model, wherein said refining further comprises second refining wherein said data-flow model is at least partly transformed into an SFG model, and combining several of said SFG models with a finite state machine description resulting in an implementable description.

25. The method of claim 24, further comprising the step of transforming said implementable description to synthesizable code.

26. The method of claim 24, wherein said synthesizable code is VHDL code.

27. A method of designing a system comprising at least one digital part, comprising refining, wherein a behavioral description of said system is transformed into an implementable description of said system, said behavioral description being represented as a first set of objects with a first set of relations therebetween and said implementable description being represented as a second set of objects with a second set of relations therebetween, wherein said refining comprises first refining wherein said behavioral description is a data-vector model and is at least partly transformed into a data-flow model, and wherein said data-flow model is an untimed floating point data-flow model, and wherein behavioral characteristics are transformed at least partly into structural characteristics, wherein said refining further comprises second refining wherein said data-flow model is at least partly transformed into an SFG model.

* * * * *

UNITED STATES PATENT AND TRADEMARK OFFICE
CERTIFICATE OF CORRECTION

PATENT NO.    : 6,233,540 B1
DATED         : May 15, 2001
INVENTOR(S)   : Schaumont et al.

It is certified that error appears in the above-identified patent and that said Letters Patent is hereby corrected as shown below:

Column 26,
Line 13, which reads "data-[]flow", should read -- data-flow --.

Signed and Sealed this

Twenty-second Day of April, 2003

JAMES E. ROGAN
*Director of the United States Patent and Trademark Office*